US009153787B2

(12) United States Patent
Balaganesan et al.

(10) Patent No.: US 9,153,787 B2
(45) Date of Patent: Oct. 6, 2015

(54) ELECTRON TRANSPORTING COMPOUNDS AND ORGANIC ELECTROLUMINESCENT DEVICES USING THE SAME

(71) Applicant: E-RAY OPTOELECTRONICS TECHNOLOGY CO., LTD., Chung-Li 320, Taiwan R.O.C. (TW)

(72) Inventors: Banumathy Balaganesan, Chung-Li (TW); Heh-Lung Huang, Chung-Li (TW); Po-Wei Hsu, Chung-Li (TW); Kun-Feng Chiang, Chung-Li (TW)

(73) Assignee: E-RAY OPTOELECTRONICS TECHNOLOGY CO., LTD., Chung-Li (TW)

( * ) Notice: Subject to any disclaimer, the term of this patent is extended or adjusted under 35 U.S.C. 154(b) by 0 days.

(21) Appl. No.: 14/098,719

(22) Filed: Dec. 6, 2013

(65) Prior Publication Data

US 2014/0163233 A1 Jun. 12, 2014

Related U.S. Application Data

(60) Provisional application No. 61/734,552, filed on Dec. 7, 2012.

(51) Int. Cl.
*H01L 51/00* (2006.01)
*H01L 51/50* (2006.01)

(52) U.S. Cl.
CPC ........ *H01L 51/0055* (2013.01); *H01L 51/0074* (2013.01); *H01L 51/0058* (2013.01); *H01L 51/0067* (2013.01); *H01L 51/5072* (2013.01)

(58) Field of Classification Search
CPC ............ H01L 51/0074; H01L 51/0067; H01L 51/0055; H01L 51/0058
USPC ........................ 546/256; 514/443; 549/43, 42
See application file for complete search history.

(56) References Cited

U.S. PATENT DOCUMENTS

2007/0072002 A1* 3/2007 Kim et al. ..................... 428/690
2009/0015144 A1* 1/2009 Takashima et al. ........... 313/504
2012/0187381 A1* 7/2012 Xia et al. ........................ 257/40

FOREIGN PATENT DOCUMENTS

KR 20110085784 * 7/2011
KR 2012120886 * 11/2012

OTHER PUBLICATIONS

Wang; Organic Electronics, 2011, 12, 595-601.*
KR20110085784 machine translation from EPO.*
KR20120120886 machine translation from KIPO.*

* cited by examiner

*Primary Examiner* — John Mabry
*Assistant Examiner* — Daniel Carcanague
(74) *Attorney, Agent, or Firm* — Amin, Turocy & Watson, LLP

(57) ABSTRACT

The present invention discloses a novel compound of Formula 1, and an organic electroluminescent device using the same. In Formula 1, X and Y independently represents an aromatic or a hetero aromatic hydrocarbon having a carbon number of from 5 to 10. $Ar_1$ to $Ar_7$ each independently represents an unsubstituted or substituted aromatic hydrocarbon having a carbon number of from 4 to C12, or an unsubstituted or substituted condensed polycyclic aromatic hydrocarbon having a carbon number of from 4 to 12; $Ar_1$ to $Ar_7$ can form an annulated or fused aromatic ring system with the adjacent aromatic hydrocarbons. When the compound of Formula I is used in the device, high luminous efficiency, longer lifetime and low driving voltage can be achieved.

Formula I
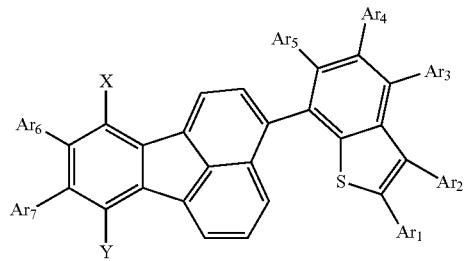
7 Claims, 8 Drawing Sheets

ELECTRON TRANSPORTING COMPOUNDS AND ORGANIC ELECTROLUMINESCENT DEVICES USING THE SAME

BACKGROUND OF THE INVENTION

1. Field of the Invention

The present invention relates to compounds comprising benzothiophene moieties linked to a fluoranthene molecular skeleton and electroluminescent devices using the same, and more particularly, to a compound comprising a substituted or unsubstituted dibenzothiophene linked directly to substituted or unsubstituted benzofluoranthene and an electroluminescent device using the same.

2. Description of Related Art

There has been an increasing interest in developing novel organic materials that cater to organic light emitting device (OLED) applications. Such devices are commercially attractive because they offer the cost-advantageous fabrication of high density pixeled displays exhibiting brilliant luminance with long life times, high efficiency, low driving voltages and wide color range.

A typical OLED comprises at least one organic emissive layer sandwiched between an anode and a cathode. When a current is applied, the anode injects holes and the cathode injects electrons into the organic layer(s). The injected holes and electrons each migrate toward the oppositely charged electrode. When an electron and hole localize on the same molecule, an "exciton", which is a localized electron-hole pair having an excited energy state, is formed. Light is emitted when the exciton relaxes through a photoemissive mechanism. To improve the charge transport capabilities and also the luminous efficiency of such devices, additional layers around the emissive layer, such as an electron transport layer and/or a hole transport layer, or an electron blocking and/or hole blocking layer(s) have been incorporated. Doping the host material with another material (i.e., guest) has been well demonstrated in literature to enhance the device performance and to tune the chromaticity. Several OLED materials and device configurations are described in U.S. Pat. Nos. 4,769, 292, 5,844,363, and 5707745, which are incorporated herein by reference in their entirety.

The reason for manufacturing an organic EL display with a multi-layered thin film structure includes stabilization of the interfaces between the electrodes and the organic layers. In addition, in organic materials, the mobility of electrons and holes significantly differ, and thus, if appropriate hole transportation and electron transportation layers are used, holes and electrons can be efficiently transferred to the luminescent layer. Also, if the density of the holes and electrons are balanced in the emitting layer, luminous efficiency can be increased. The proper combination of organic layers described above can enhance the device efficiency and lifetime. However, it has been very difficult to find an organic material that satisfies all the requirements for use in practical display applications.

Tris(8-hydroxyquinoline)aluminum ($Alq_3$) is one of the widely used electron transporting material; however, it has an intense green emission and devices using the same exhibits higher driving voltages. Therefore, it is crucial to find an electron transporting molecule that has excellent properties compared to the conventional material in all practical aspects, such as high efficiency, reduced driving voltage and operational stability.

Organic small molecules having imidazole groups, oxazole groups and thiazole groups have been frequently reported as materials for electron injection and transportation layers, as described in the literature Chem. Mater. 2004, No. 16, p. 4556.

U.S. Pat. No. 5,645,948 and U.S. Pat. No. 5,766,779 discloses a representative material, 1,3,5-tris(1-phenyl-1H-benzimidazol-2-yl)benzene (TPBI), for electron transportation having blue emission. TPBI has three N-phenyl benzimidazole groups, in 1,3,5-substitution sites of benzene and functions both as an electron transporting and an emitting material. However, TPBI has lower operational stability.

U.S. Pat. No. 6,878,469 discloses a compound, wherein the 2-phenyl benzimidazolyl group is linked to the C-2, C-6 positions of anthracene framework. US20080125593, KR20100007143 discloses electron transporting materials comprising imidazopyridyl or benzimidazolyl groups in its molecular skeleton, exhibiting low driving voltage and high efficiency. However, these materials also lack operational stability.

Fluoranthene derivatives are well known in the art as being useful as light emitting compounds, have been disclosed in JP2002069044, JP2005320286, US20070243411, WO2008059713, WO2011052186. U.S. Pat. No. 7,879,465 and U.S. Pat. No. 8,076,009 disclose the use of annulated fluoranthene in the electron injection and electron transport layers. However, these devices do not have all desired EL characteristics in terms of high luminance, operational stability and reduced driving voltage.

Dibenzothiophenes (DBT) are classified as chalcogenophenes and are cheap and commercial available, which has been reported to be one of the most abundant compounds in gas oil. DBT has a high ionization potential (IP) and a large band gap, which does not show have intense absorptions in the visible region. Its co-planarity is favorable for intermolecular interaction. KR20110085784 discloses benzodithiophenes used in the light emitting devices. US 20120187381 discloses the use of azadibenzo moieties linked to anthracene as electron transporting materials, and they still need to improve in terms of stability and driving voltage.

Accordingly, there remains a need to develop a compound for use in an organic light emitting device that can overcome the above drawbacks.

SUMMARY OF THE INVENTION

An object of the present invention is to provide a compound for use in an electron transport layer or a light emitting layer of an organic light emitting device to provide the device with high luminous efficiency, longer lifetime and low driving voltage, and an electroluminescent device using the same.

The present invention provides a benzothiophene linked to a fluoranthene molecular skeleton having the following Formula (I):

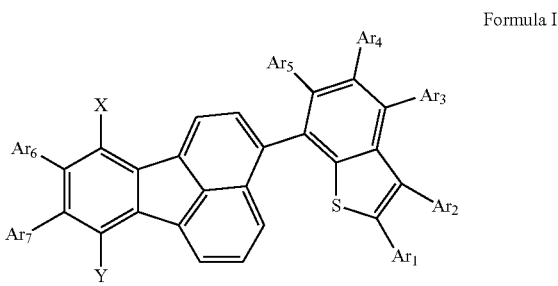

Formula I wherein X and Y independently represents an aromatic or a hetero aromatic hydrocarbon having a carbon number of from 5 to 10, and Ar$_1$ to Ar$_7$ each independently represents an unsubstituted or substituted aromatic hydrocarbon having a carbon number of from 4 to 12, or an unsubstituted or substituted condensed polycyclic aromatic hydrocarbon having a carbon number of from 4 to 12; Ar$_1$ to Ar$_7$ can form an annulated or fused aromatic ring system with the adjacent aromatic hydrocarbons.

In one embodiment, the compound has a formula selected from the group consisting of Formula (II) to Formula (XIII):

Formula II

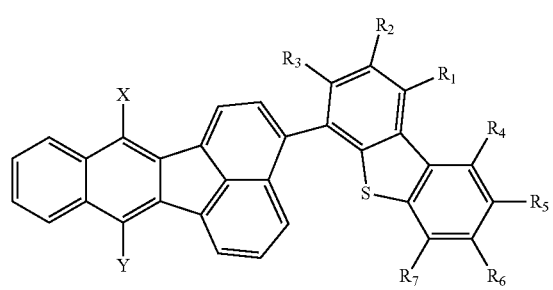

Formula III

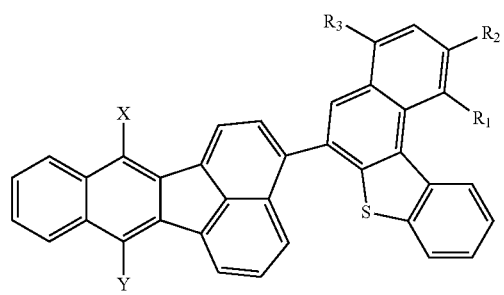

Formula IV

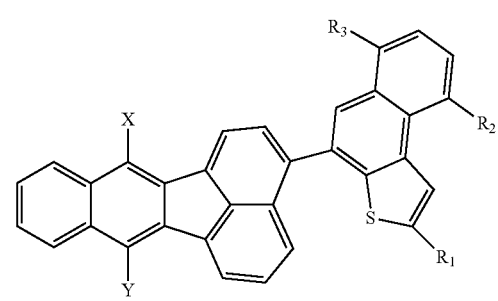

Formula V

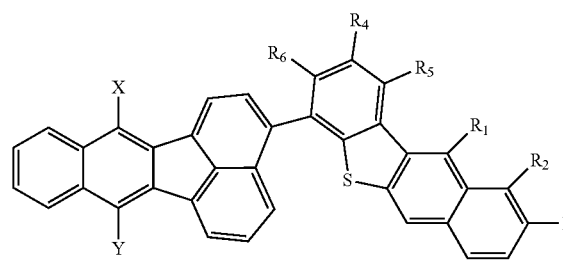

Formula VI

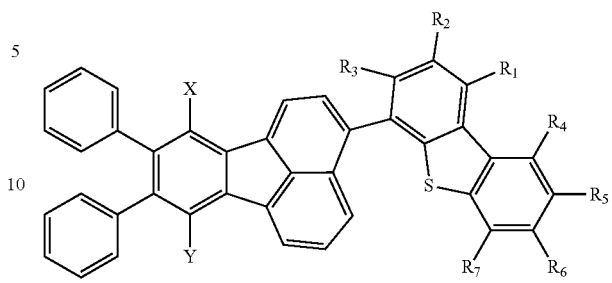

Formula VII

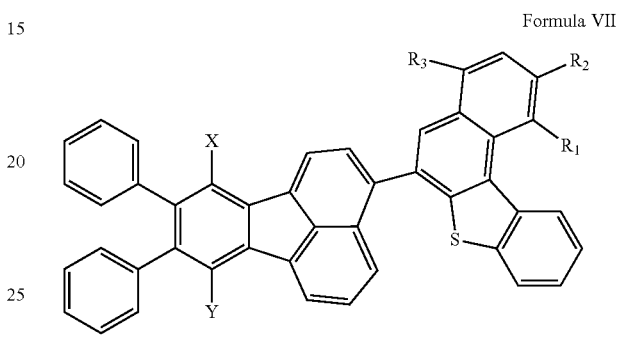

Formula VIII

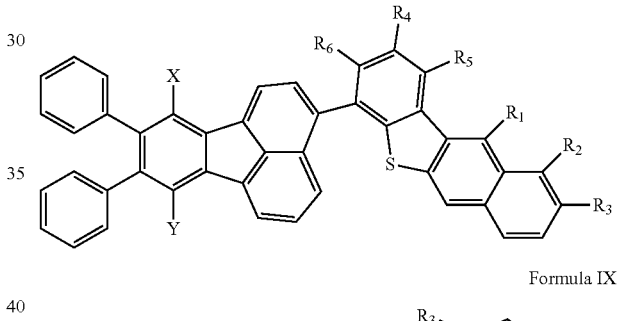

Formula IX

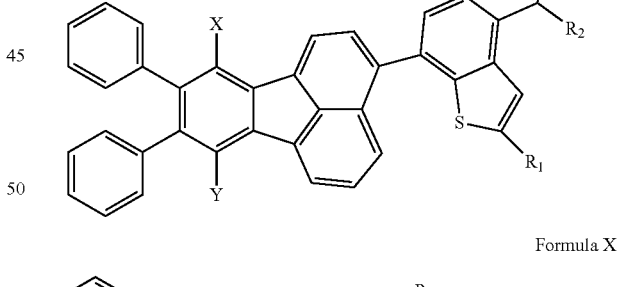

Formula X

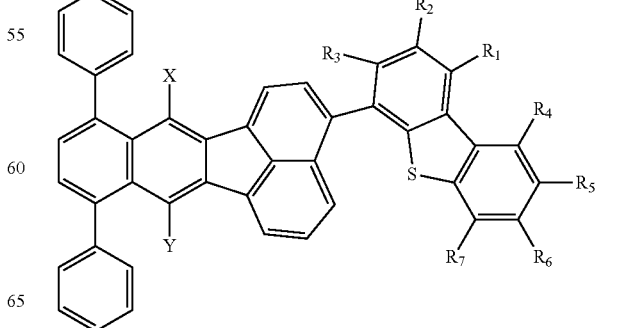

-continued

Formula XI

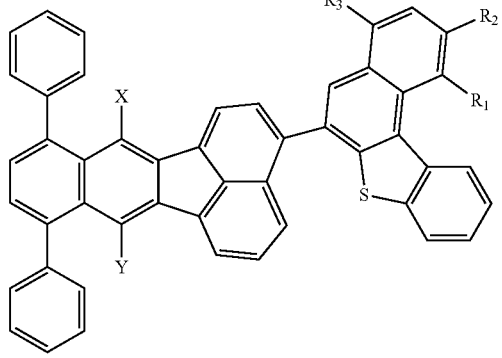

Formula XII

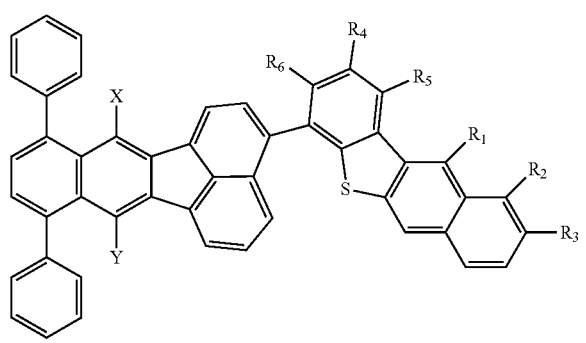

Formula XIII

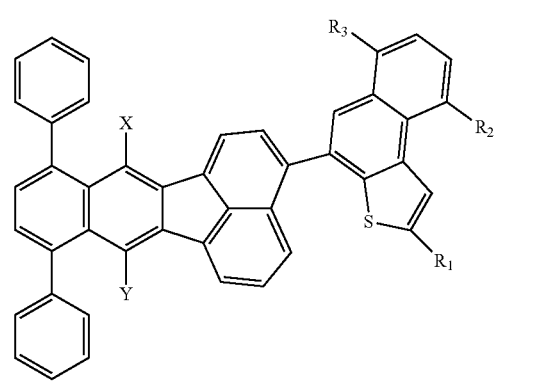

wherein X and Y independently represents an aromatic or a hetero aromatic hydrocarbon having a carbon number of from 5 to 10, and $R_1$ to $R_7$ are independently selected from the group consisting of hydrogen, deuterium, alkyl, alkoxy, amino, silyl, cyano, aryl, and heteoaryl.

In one embodiment, X and Y are selected from the group consisting of phenyl, 2-tolyl, 3-tolyl, 4-tolyl, 4-pyridyl, 1-naphthyl, and 2-naphthyl.

The present invention further provides a process for producing a compound represented by a formula selected from the group consisting of Formulae (II) to (XIII).

In one embodiment, the compound represented by a formula selected from the group consisting of Formulae (II) to (XIII) is capable of being made into an amorphous thin film for organic electroluminescent devices, by means of a vacuum deposition method or a spin coating method.

The present invention further provides an organic electroluminescent device that utilizes a compound represented by a formula selected from the group consisting of Formulae (II) to (XIII).

In one embodiment, the compound is used in an electron transport layer or an electron injection layer as a single material or in combination with an n-type dopant material.

In another embodiment, the compound is used in one selected from the group consisting of a light emitting layer, a hole block layer and an electron block layer.

In a further embodiment, the compound is used in a light emitting layer used in combination with a fluorescent or a phosphorescent emitter.

In one embodiment, the organic electroluminescent device is one of a fluorescent organic electroluminescent device and a phosphorescent organic electroluminescent device.

Organic electroluminescent devices of the present invention exhibit a longer lifetime and better thermal stability with high efficiency and low driving voltage. In addition, by using the organic compounds of the present invention, it becomes possible to provide an organic electroluminescent device which can emit white light.

BRIEF DESCRIPTION OF THE DRAWINGS

The objects, spirits, and advantages of the preferred embodiments of the present invention will be readily understood by the accompanying drawings and the detailed descriptions, wherein.

DETAILED DESCRIPTION OF THE PREFERRED EMBODIMENTS

Figure 1:
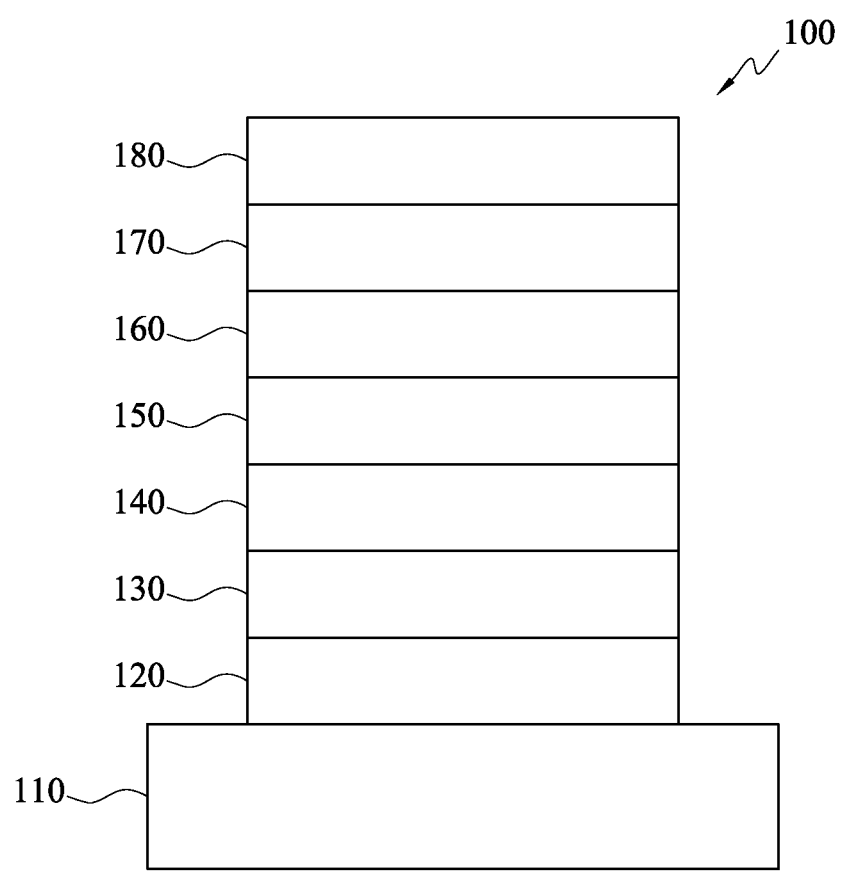
FIG. 1 is a cross-sectional view illustrating an organic light emitting device according to an embodiment of the present invention.

The detailed description of the present invention is illustrated by the following specific examples. Persons skilled in the art can conceive the other advantages and effects of the present invention based on the disclosure contained in the specification of the present invention.

A compound for an organic electroluminescent device according to this invention is represented general Formula (I). Preferably, the compound of Formula (I) is one of compounds represented by Formula (II) to (XIII).

In the Formula (II) to (XIII), X and Y represents an aromatic or a hetero aromatic hydrocarbon having carbons from C5 to C10; X and Y may be the same or different; X and Y may be selected from a group consisting of phenyl, tolyl, pyridyl, naphthyl. R1 to R7 are independently selected from the group consisting of hydrogen, deuterium, alkyl, alkoxy, amino, silyl, cyano, aryl, heteoaryl.

Preferable examples of the compounds represented by the aforementioned Formula (II) to (XIII) are shown below (A1-A24; B1-B24; C1-C24; D1-D24; E1-E24; F1-F24; G1-G24; H1-H24) but not limited to.

A1
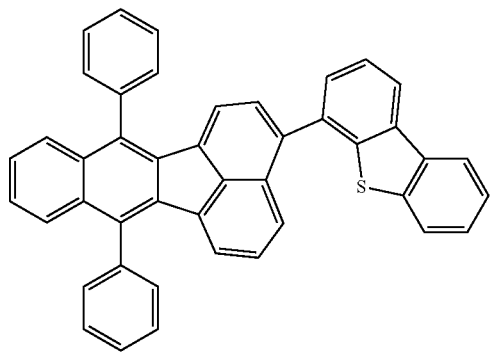
A5
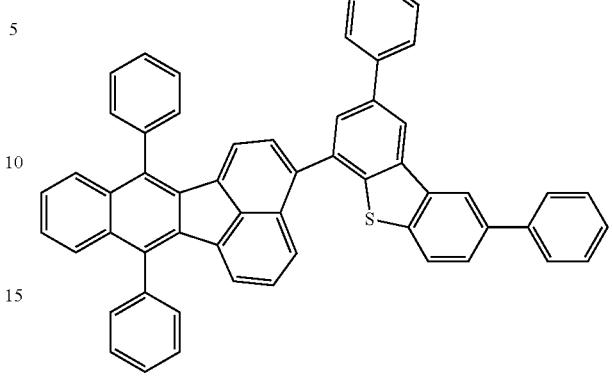
A2
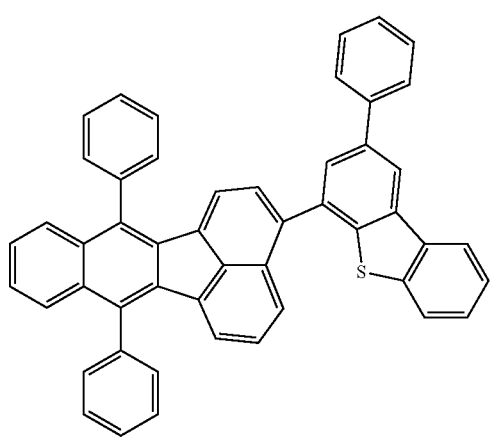
A6
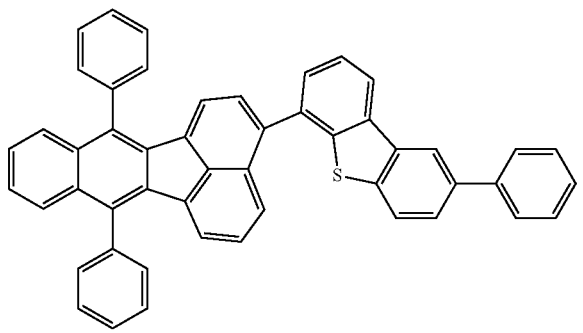
A3
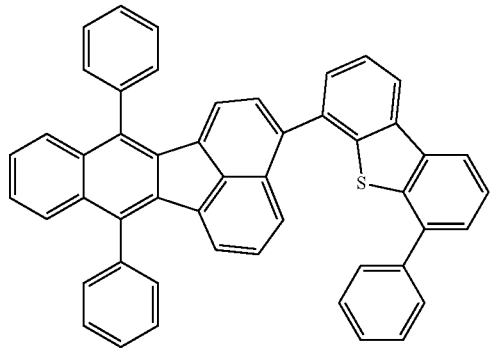
A7
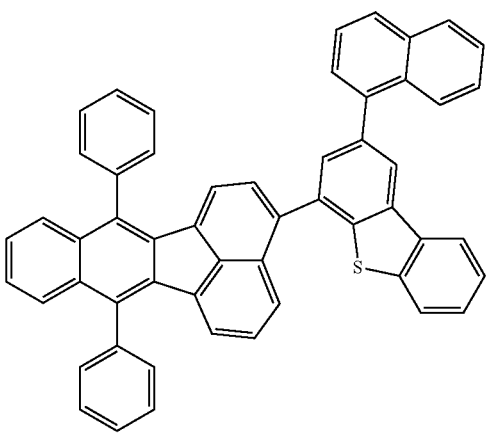
A4

-continued
A8
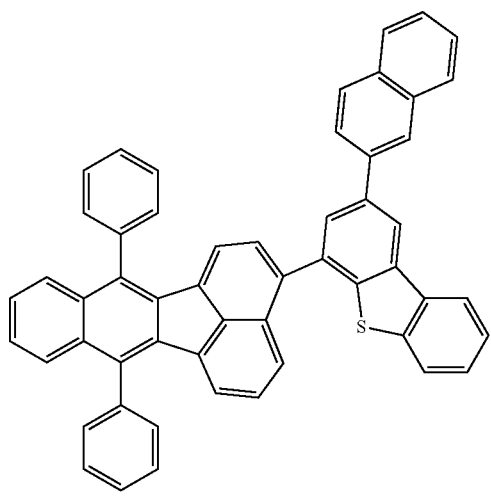
A11
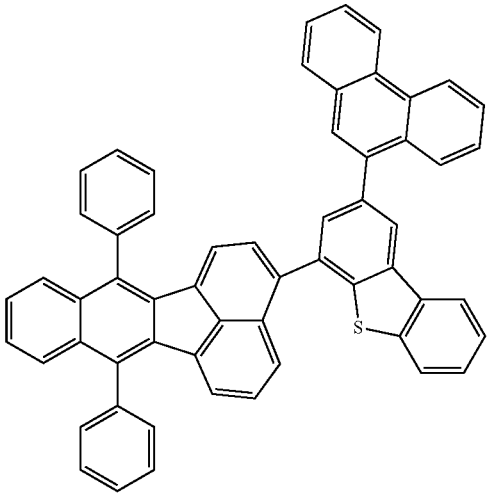
A9
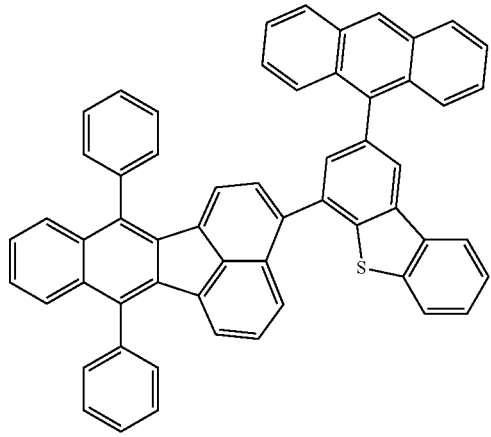
A12
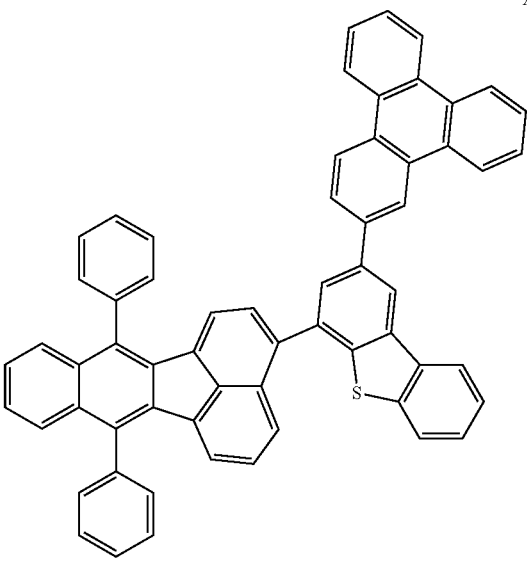
A10
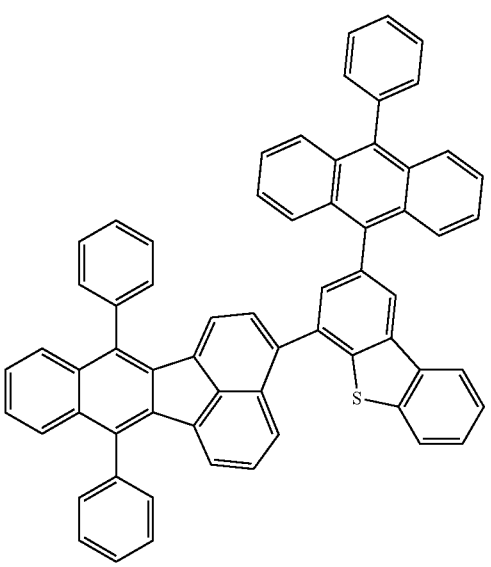
A13
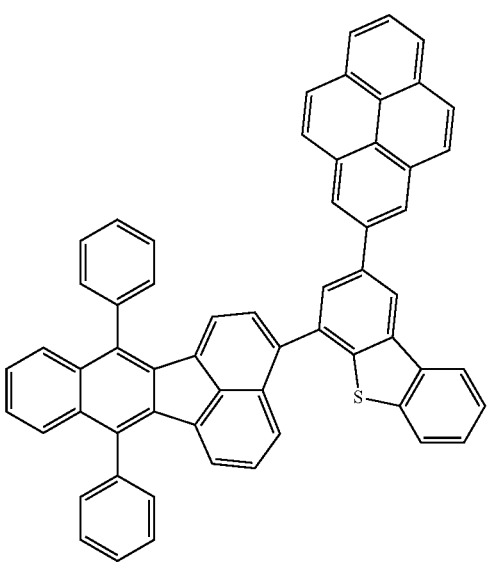

A14
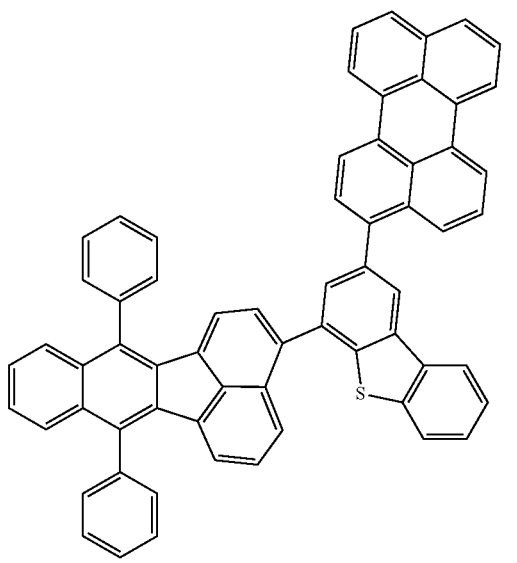
A15
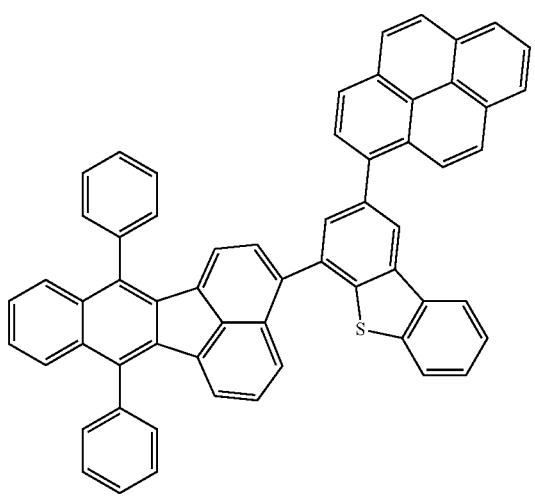
A16
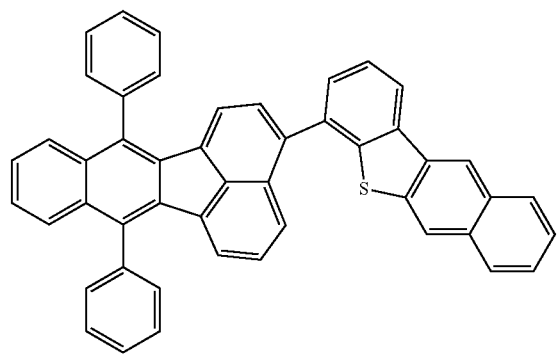
A17
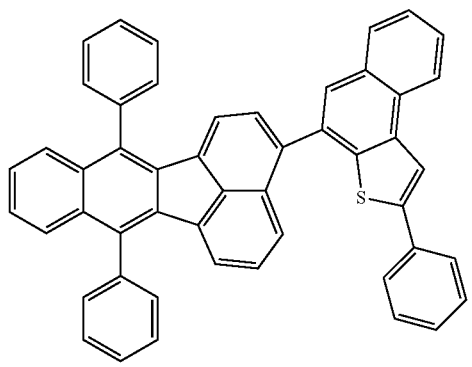
A18
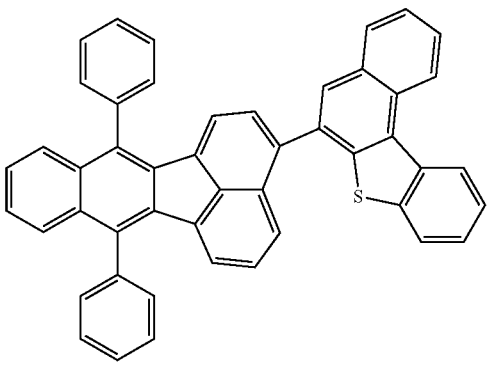
A19
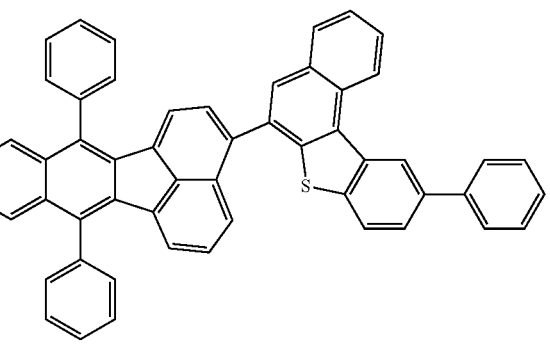
A20
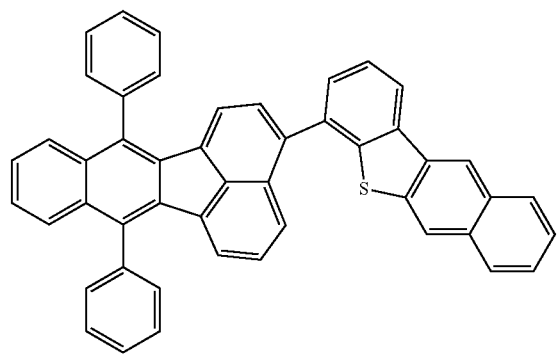

A21
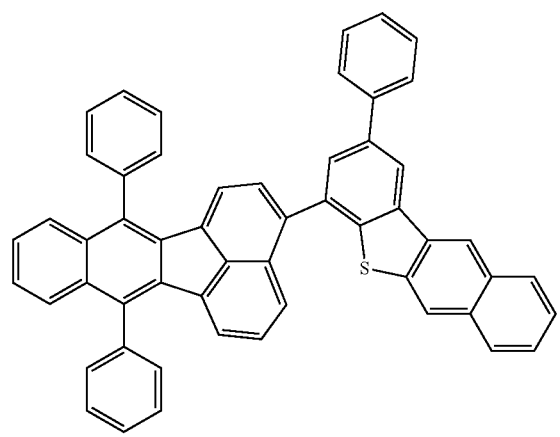
A22
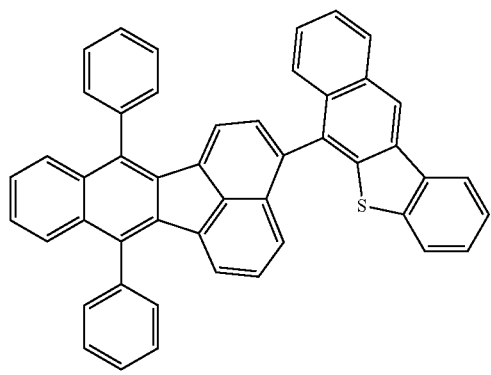
A23
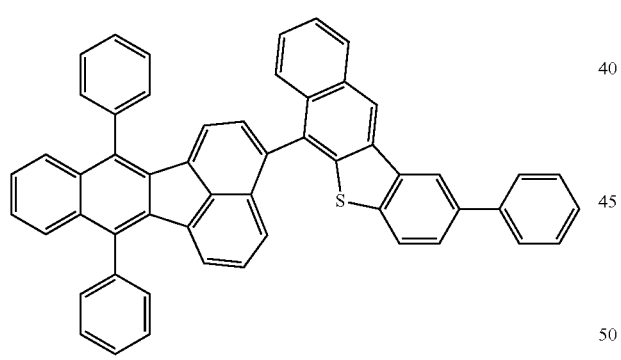
A24
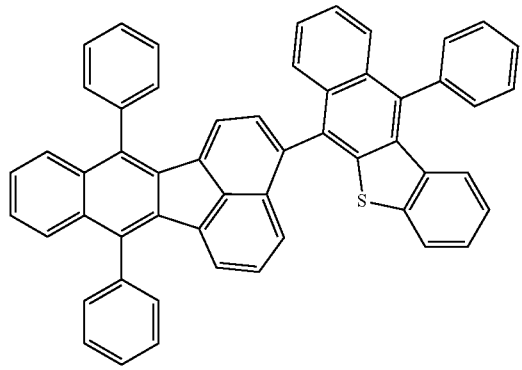
B1
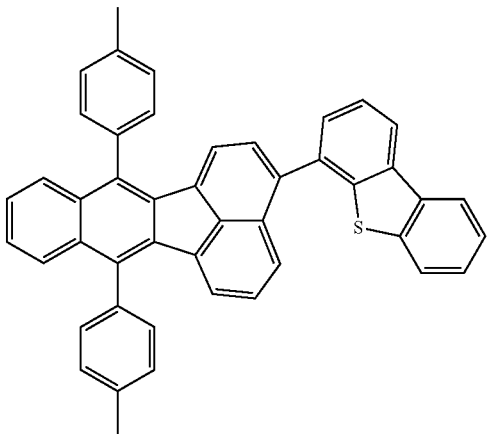
B2
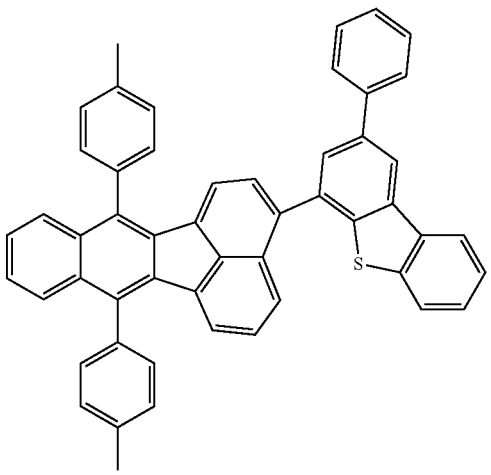
B3
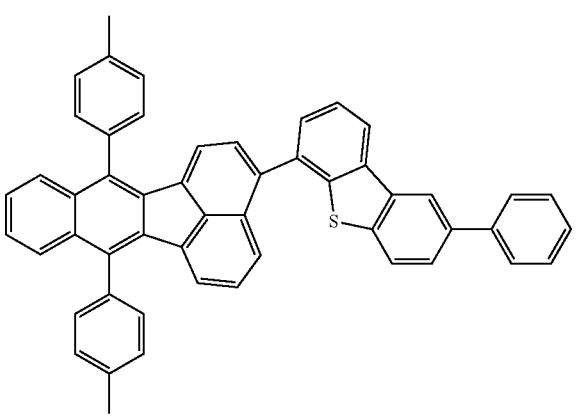

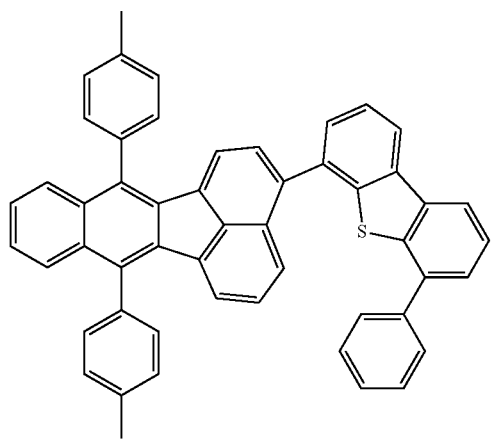
B4
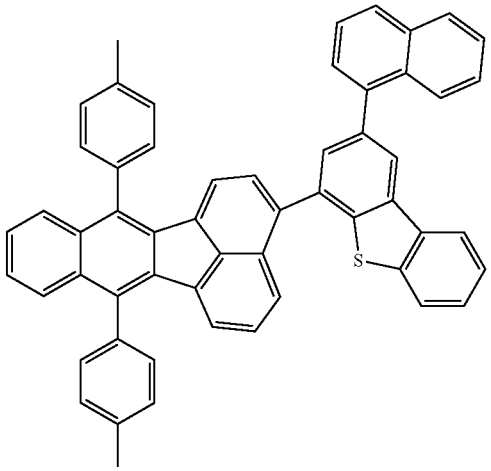
B7
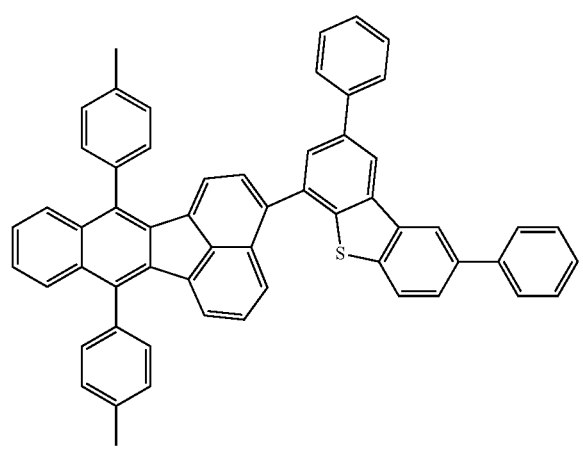
B5
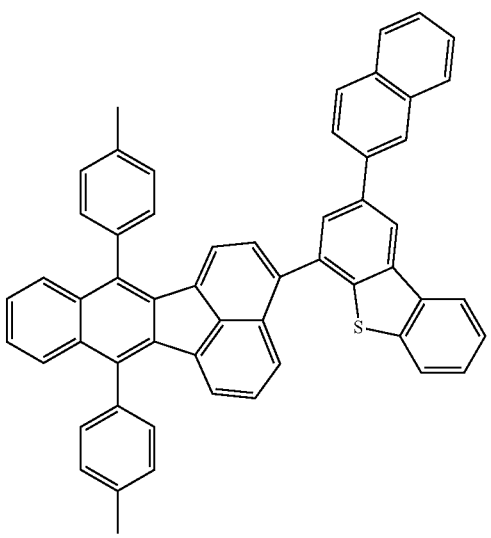
B8
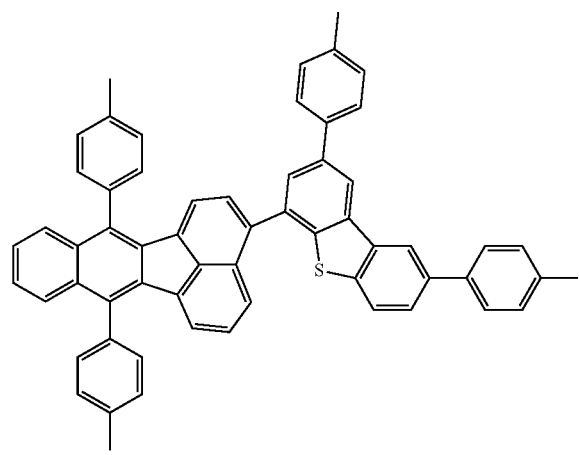
B6
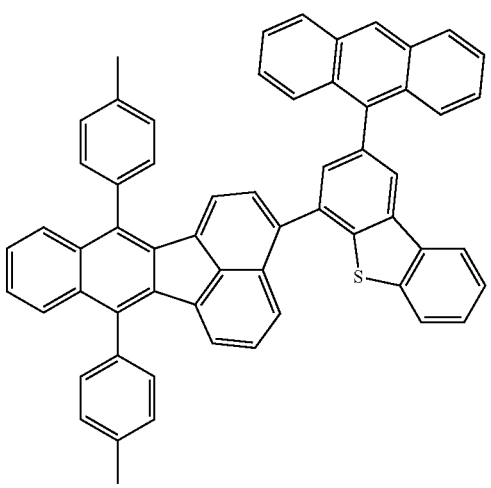
B9

-continued
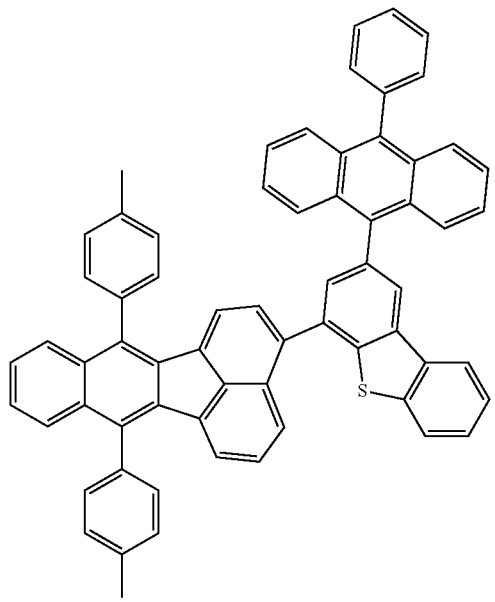
B10
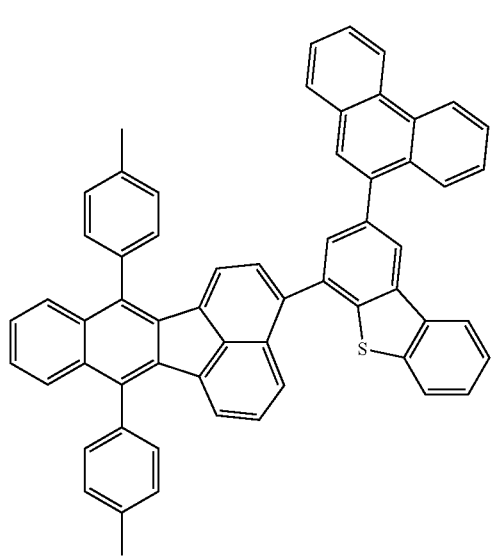
B11
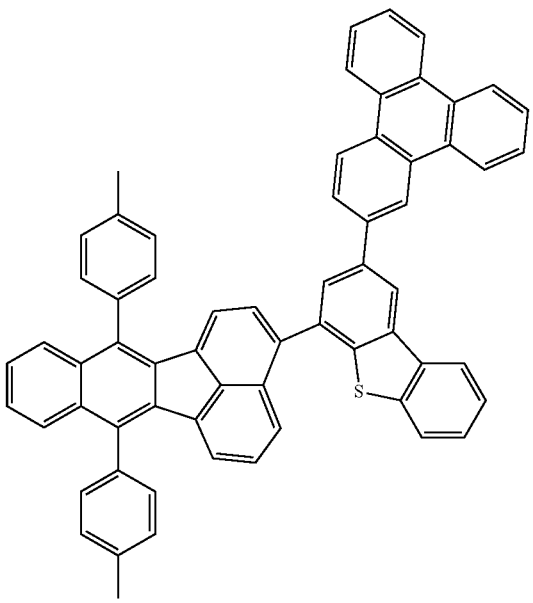
B12
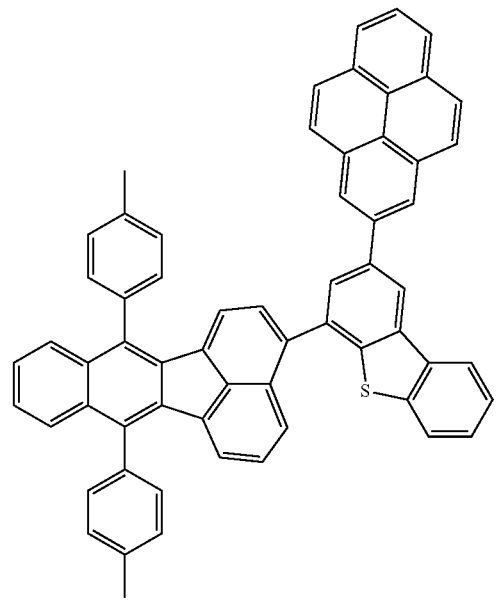
B13

B14
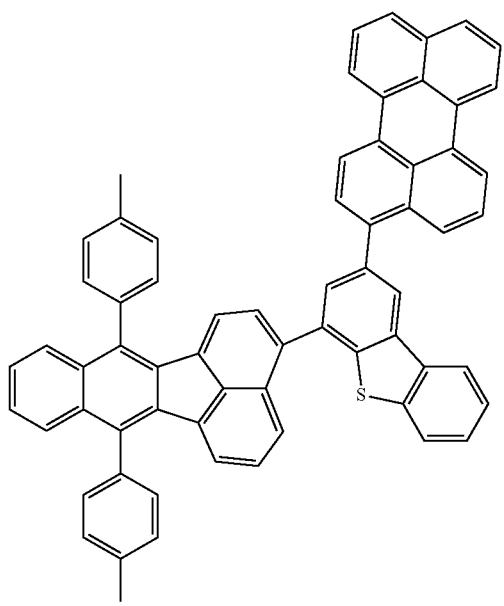
B15
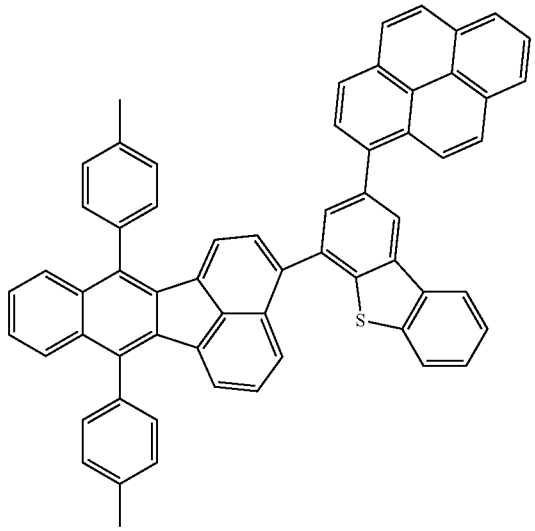
B16
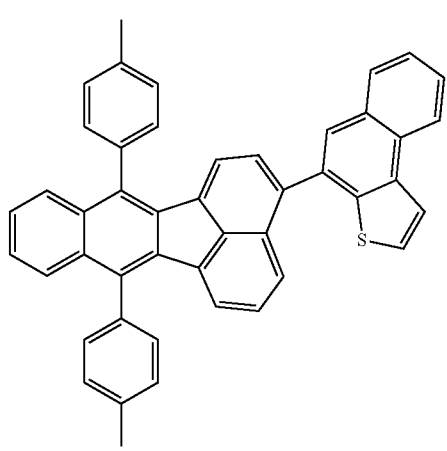
B17
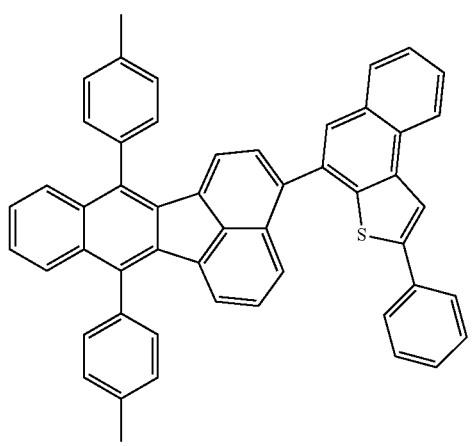
B18
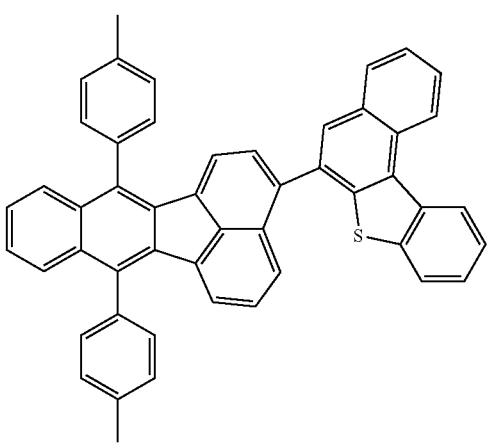
B19
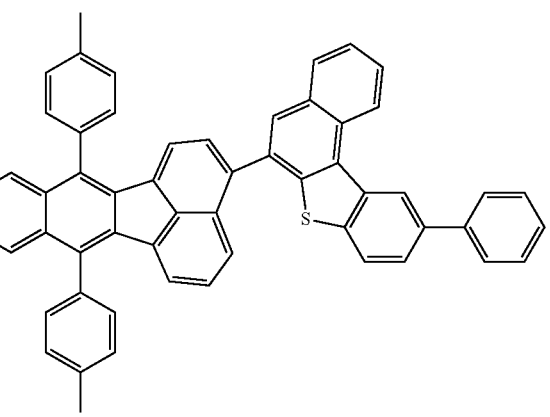

B20
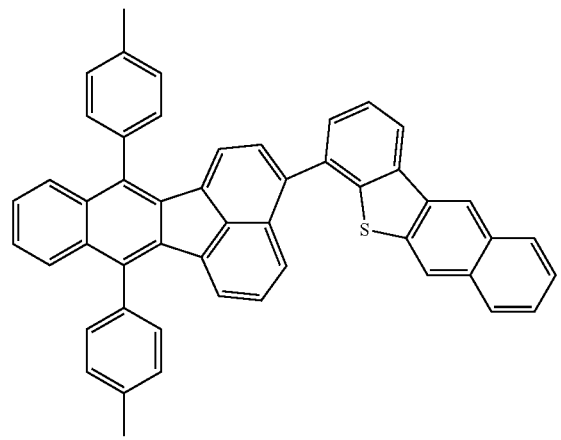
B21
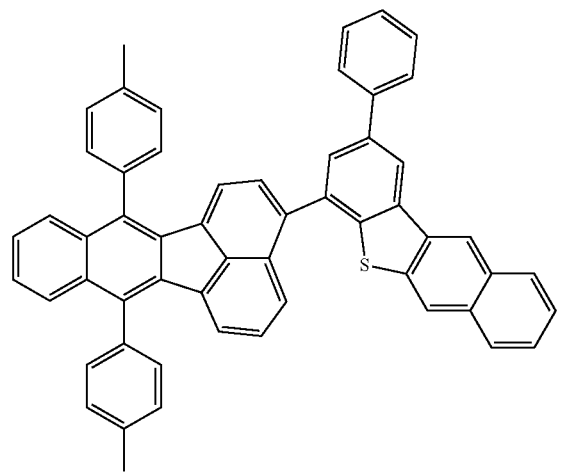
B22
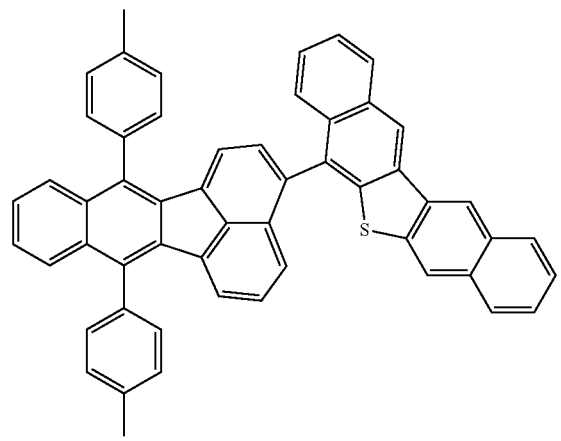
B23
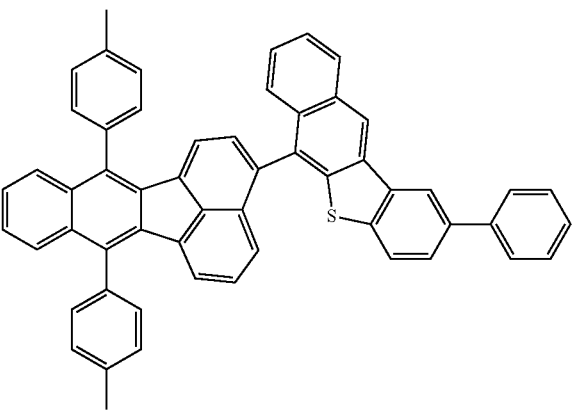
B24
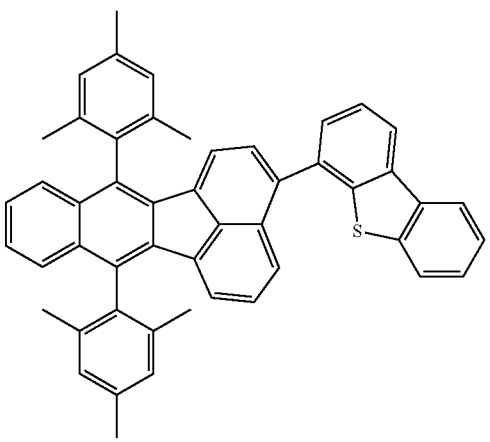
C1

C2
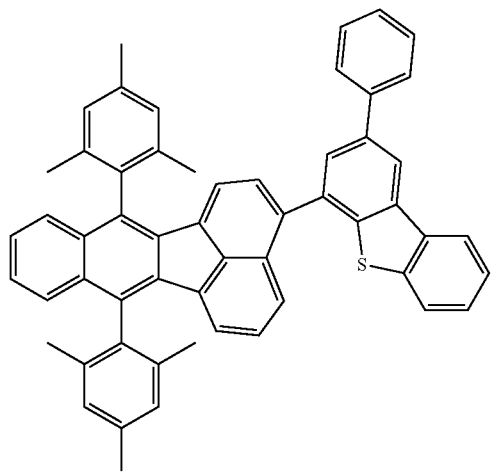
C5
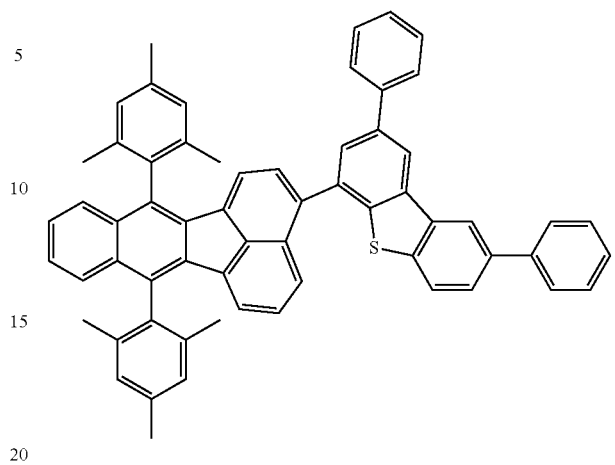
C3
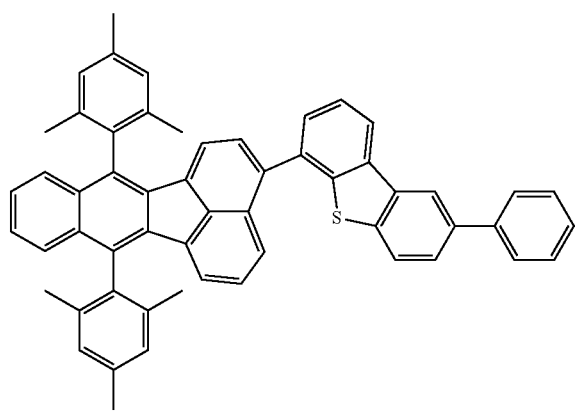
C6
C4
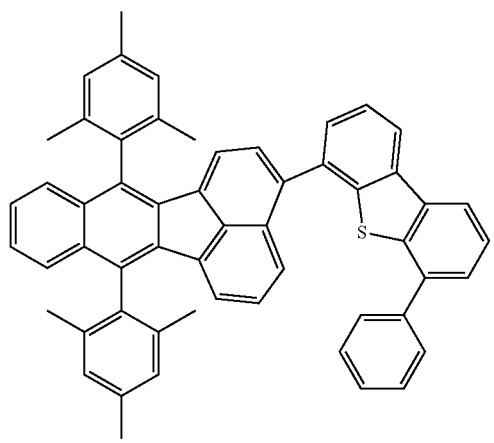
C7
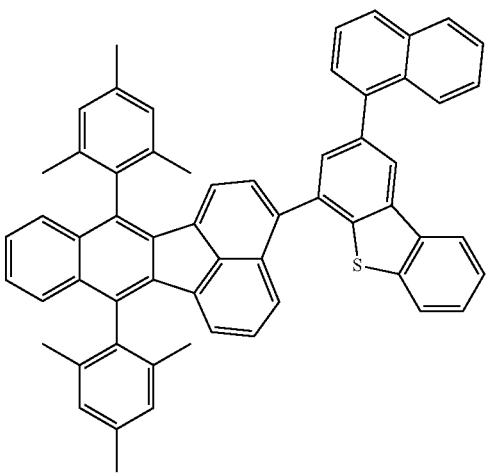

C8
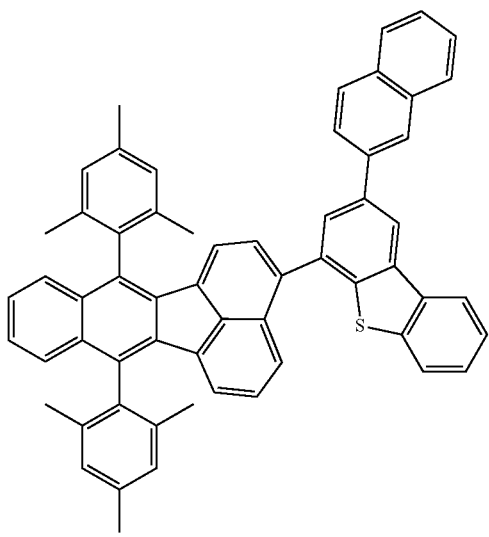
C11
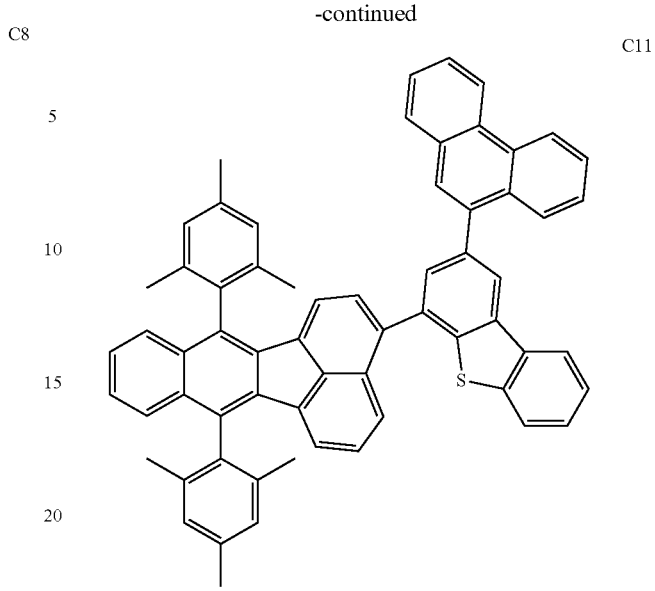
C9
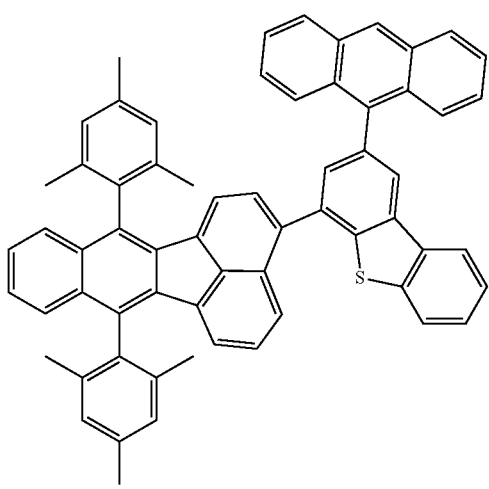
C10
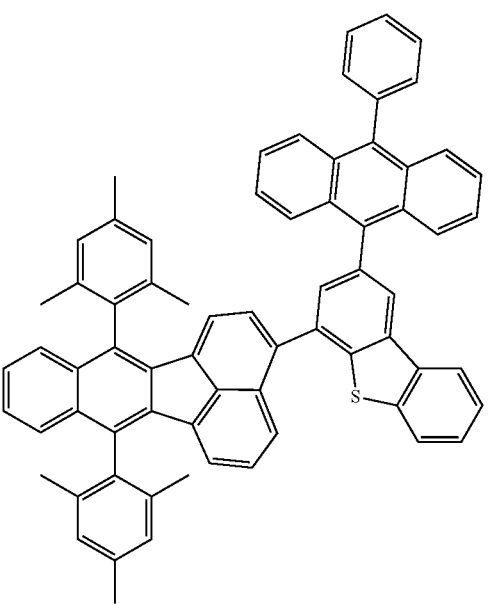
C12
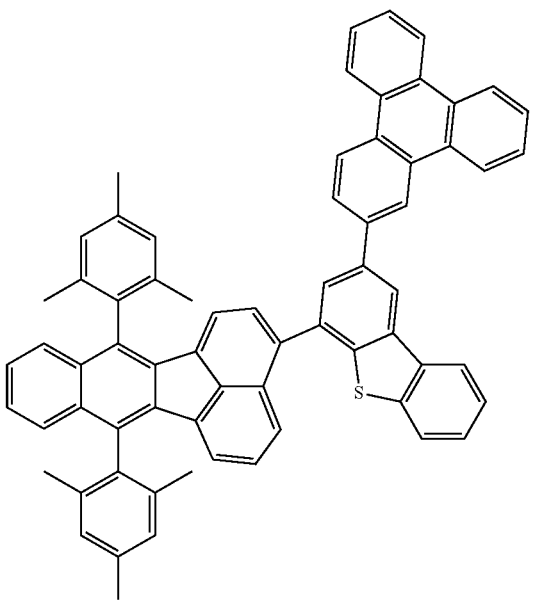

C13
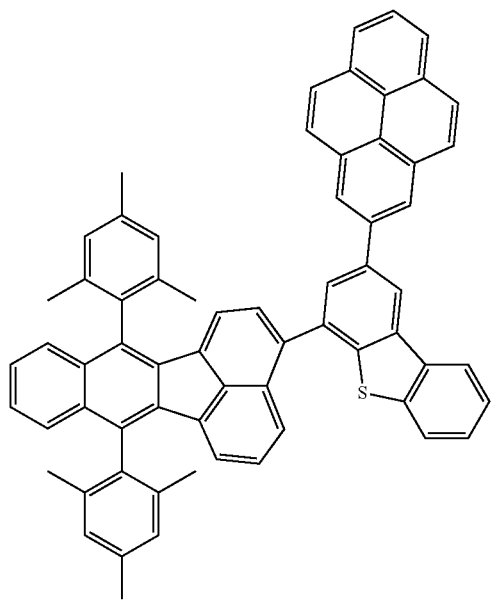
C15
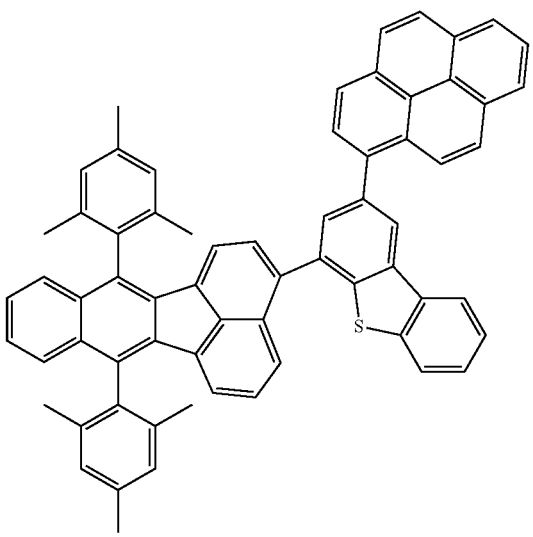
C16
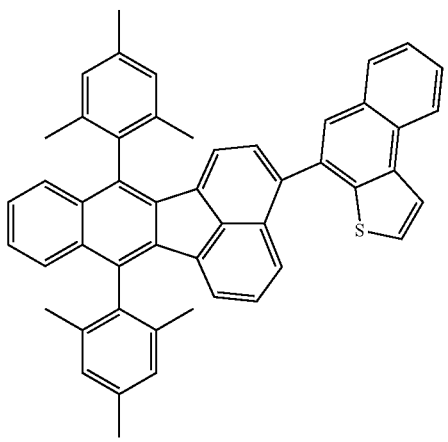
C14
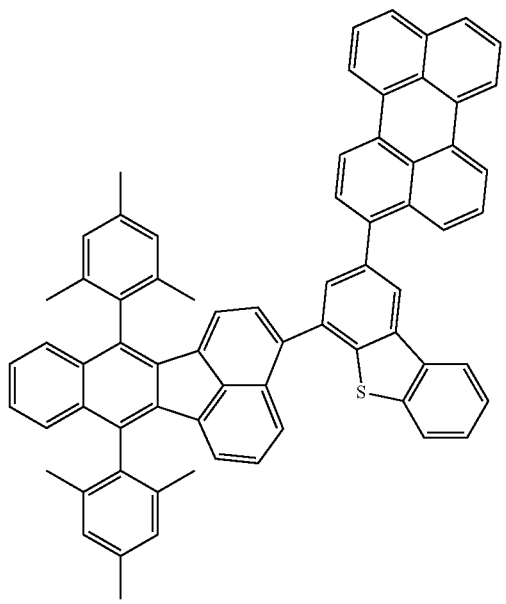
C17
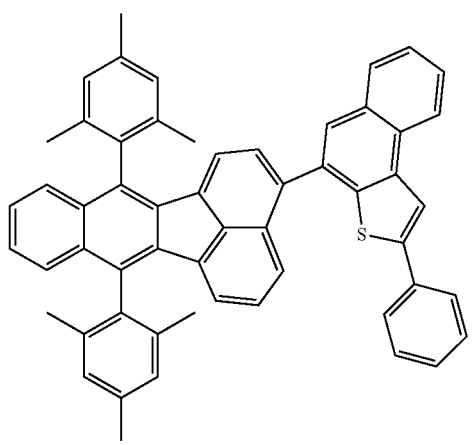

C18
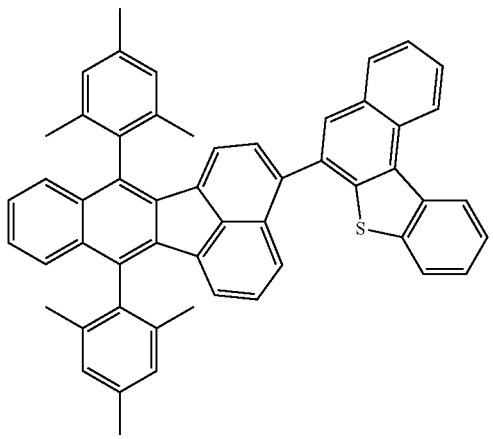
C19
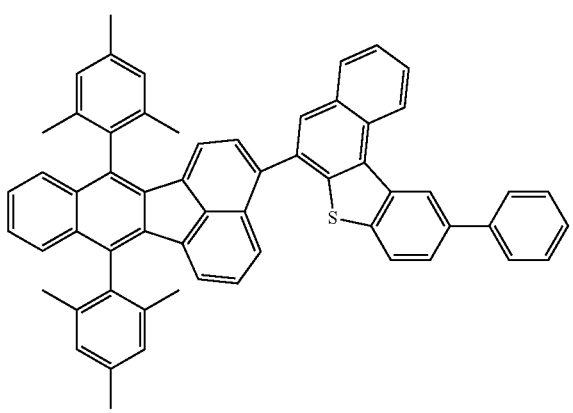
C20
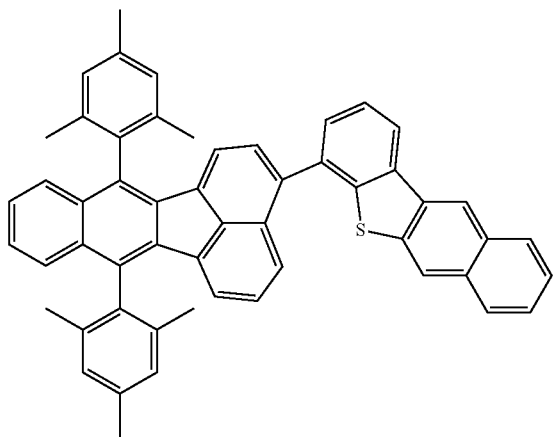
C21
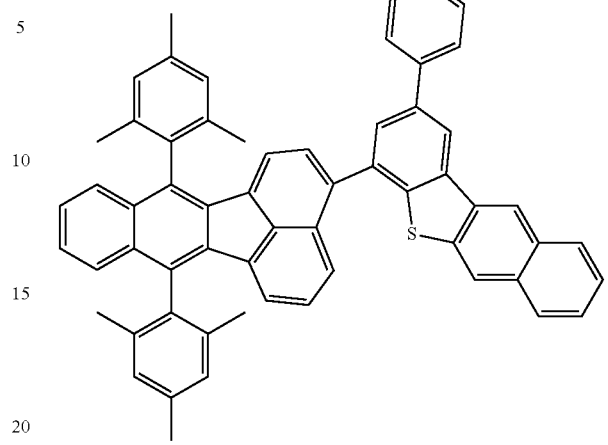
C22
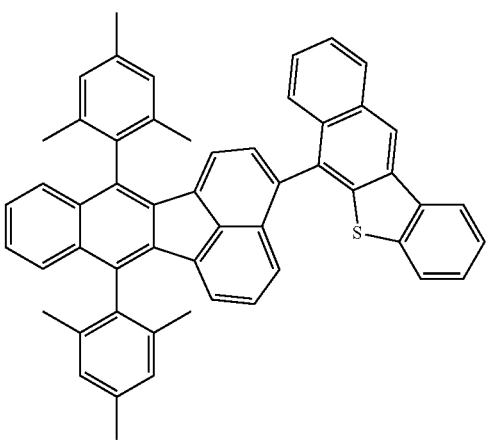
C23
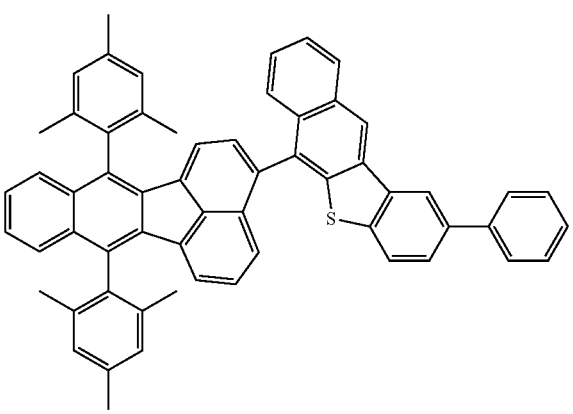

C24
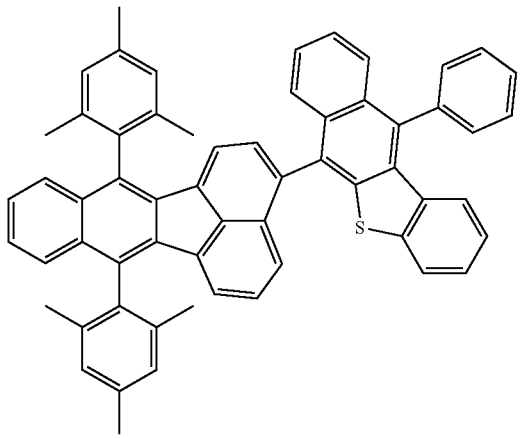
D1
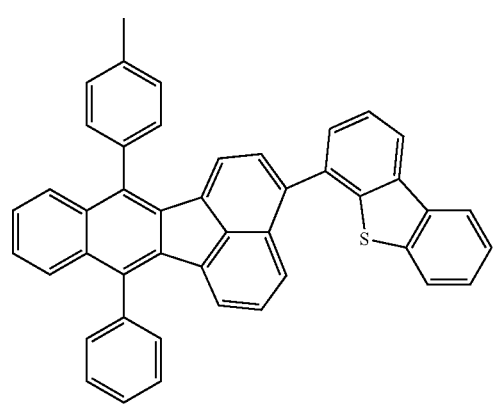
D2
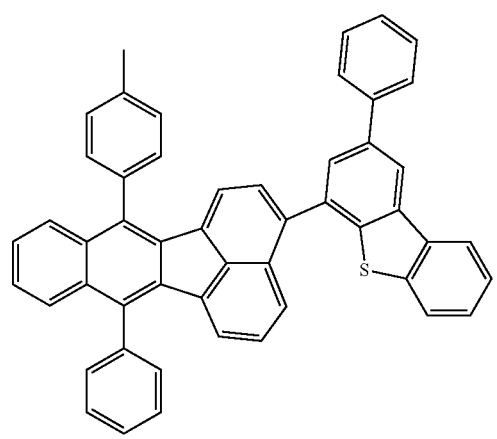
D3
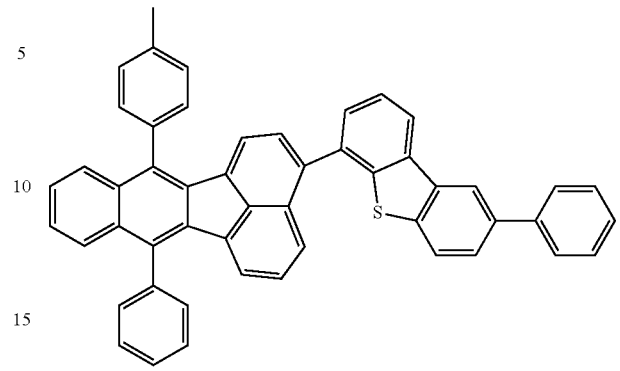
D4
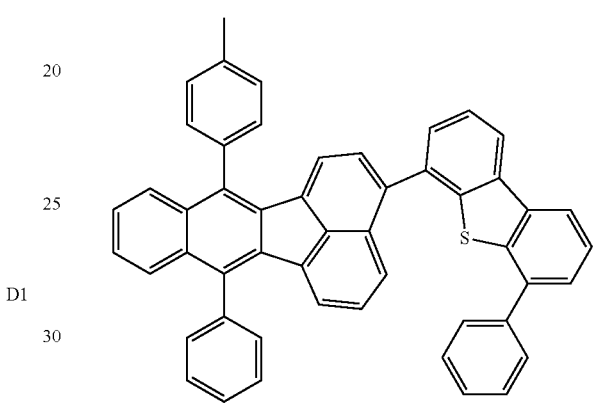
D5
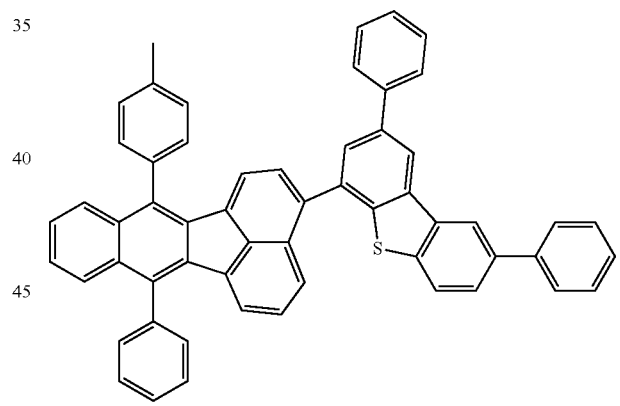
D6
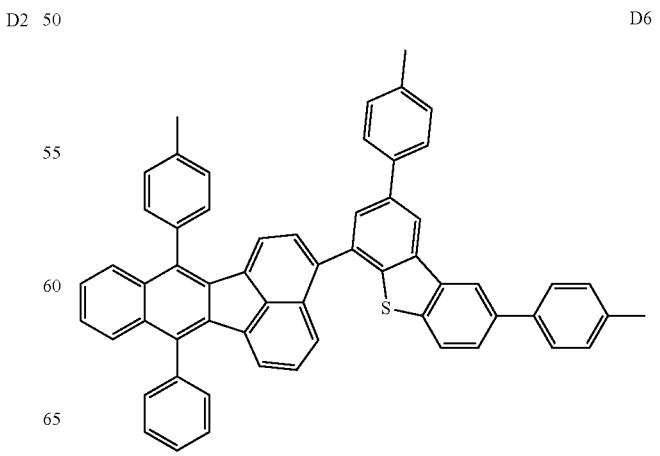

D7
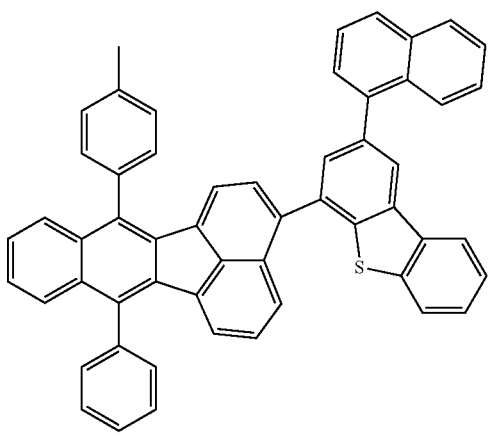
D8
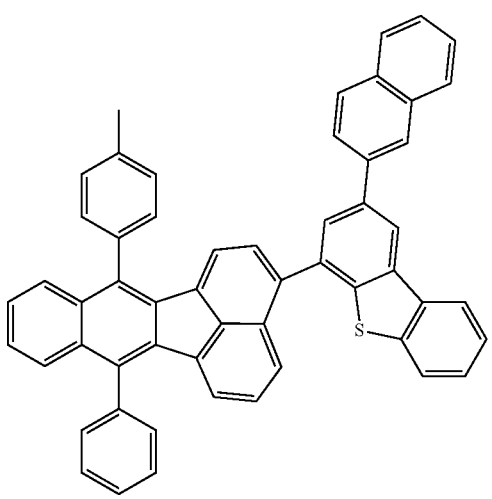
D9
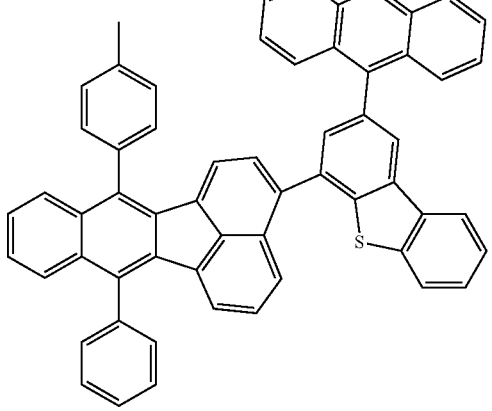
D10
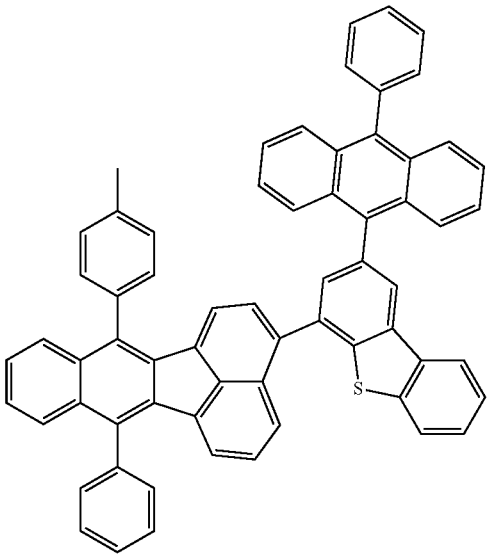
D11
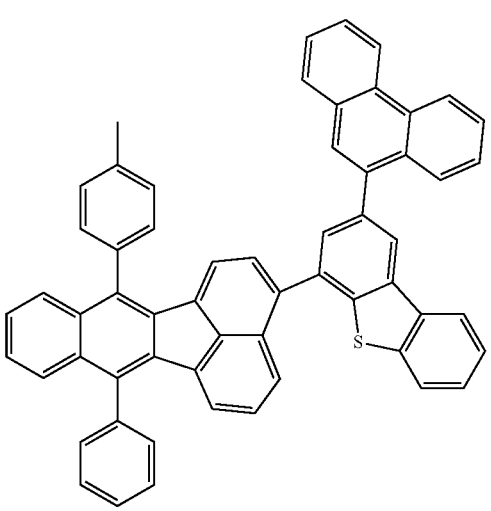
D12
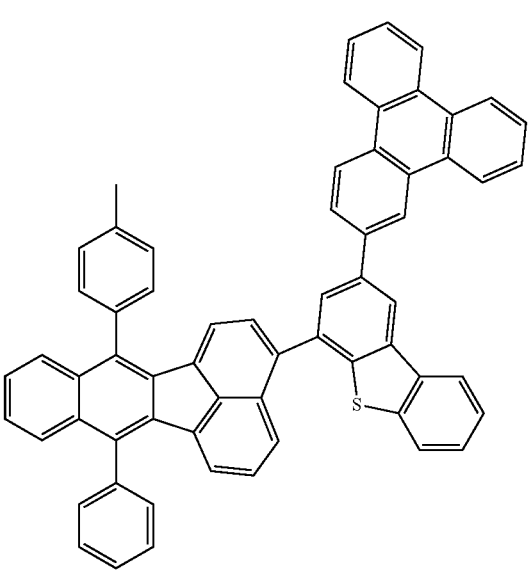

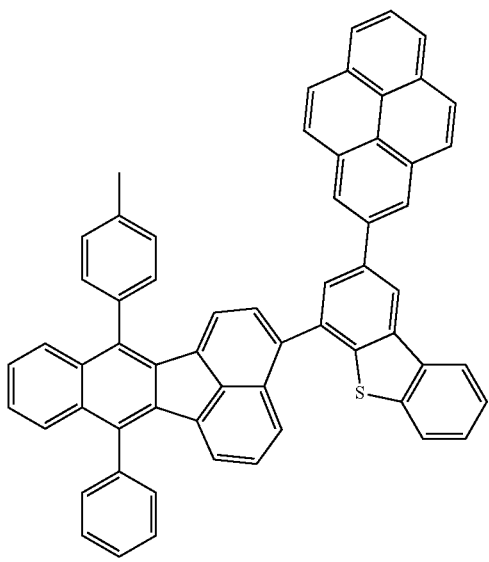
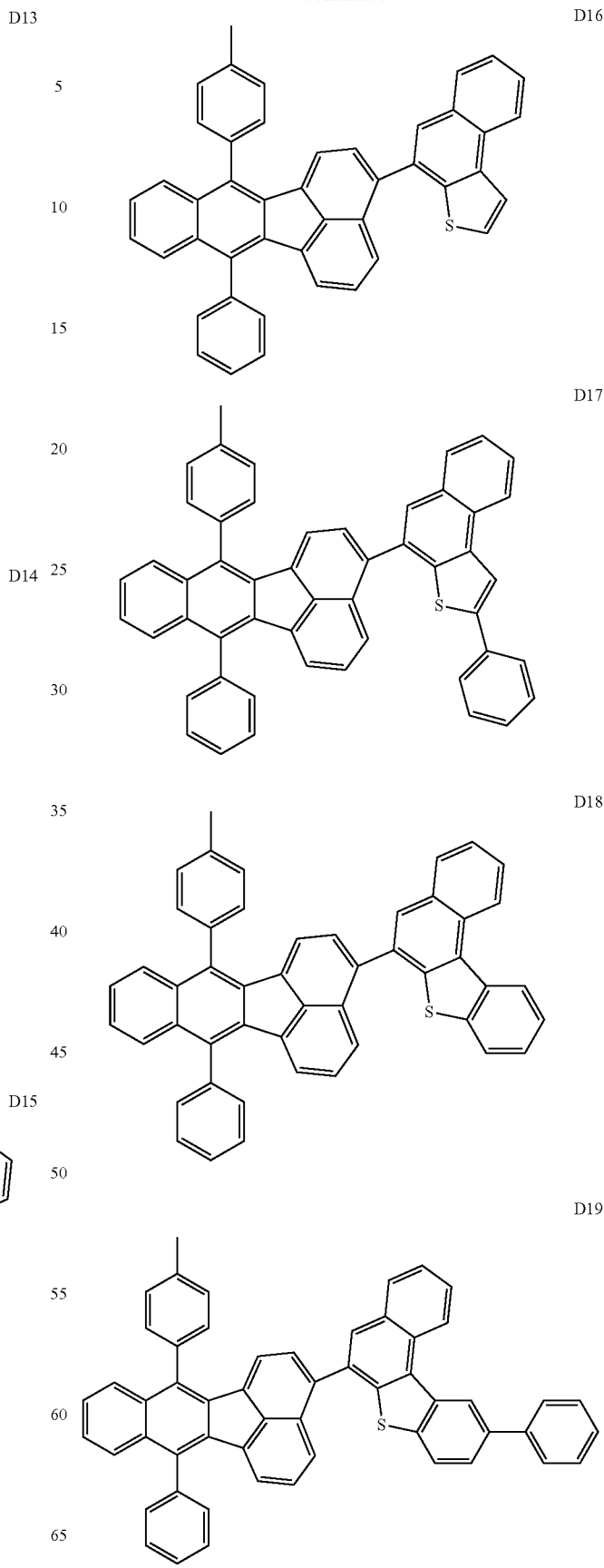

D20
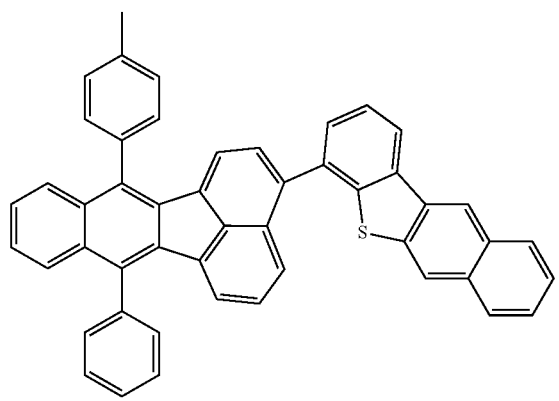
D21
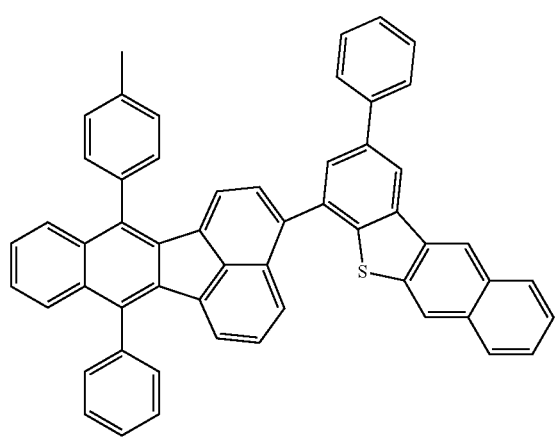
D22
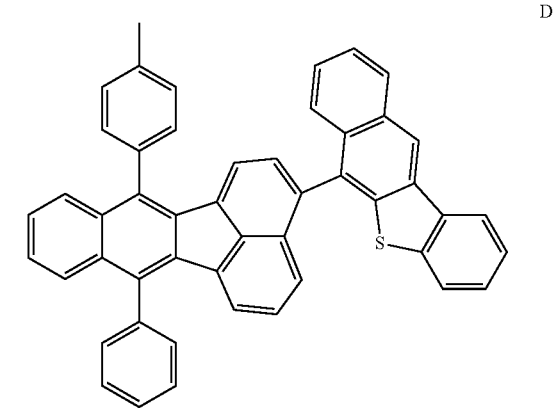
D23
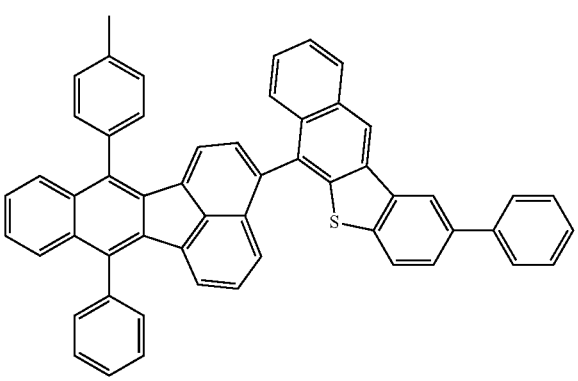
D24
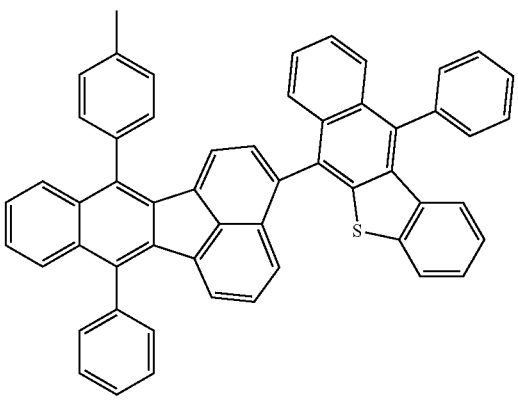
E1
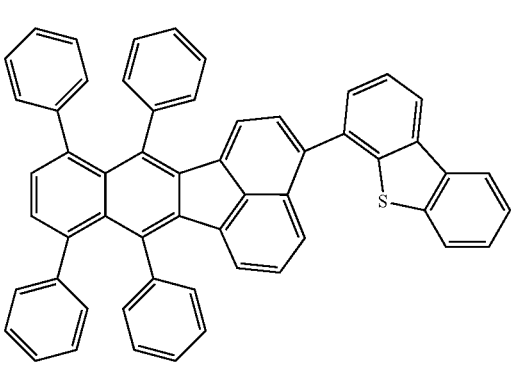
E2
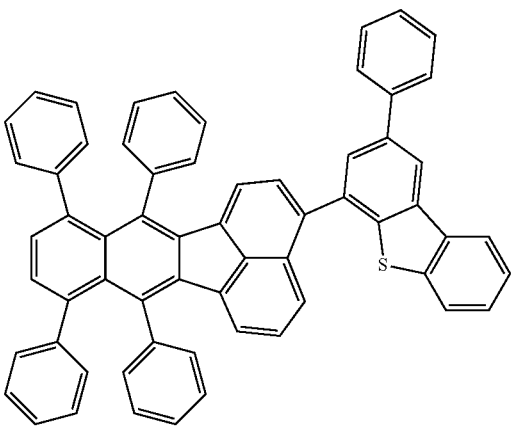
E3
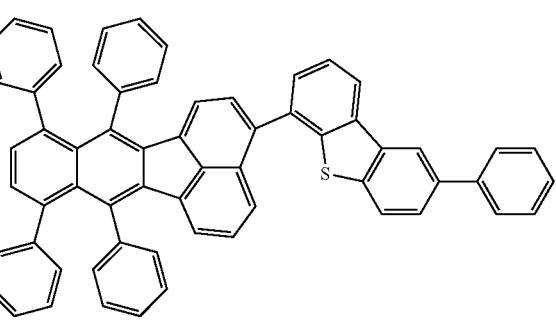

E4
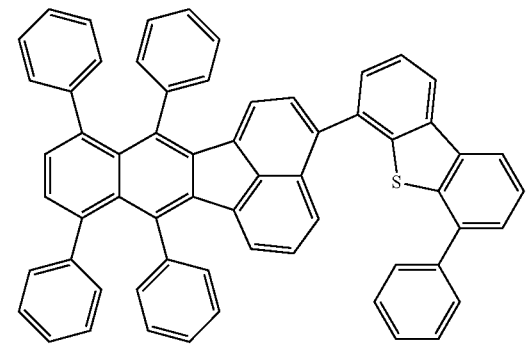
E5
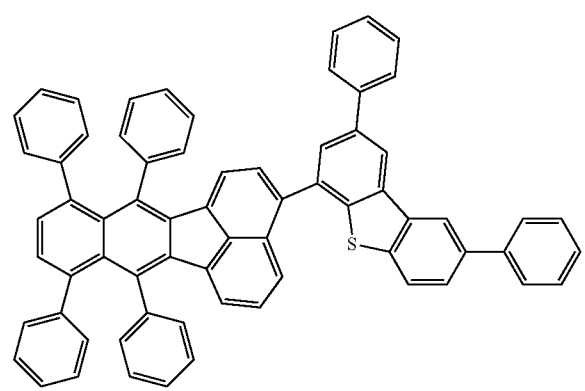
E6
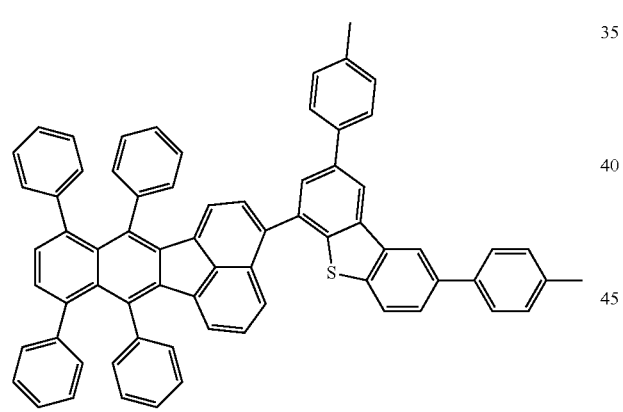
E7
E8
E9
E10
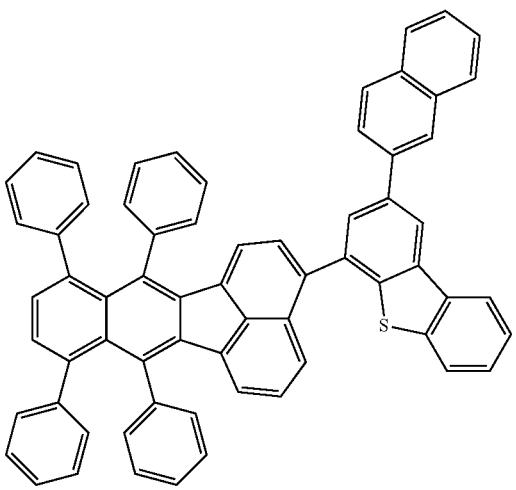
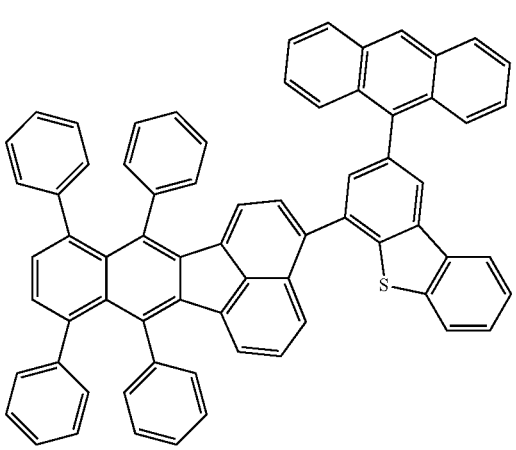
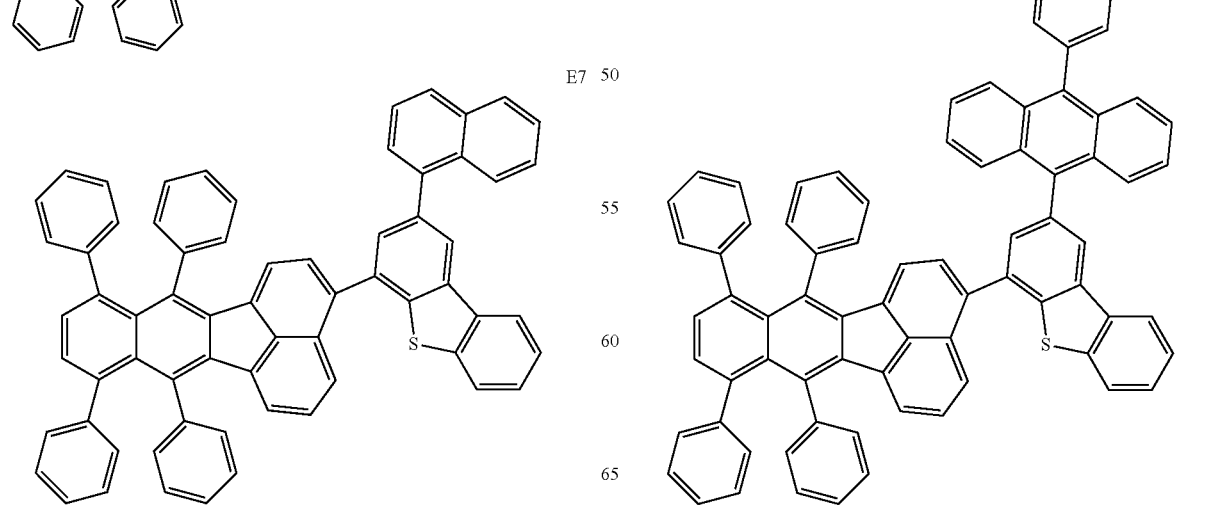

E11
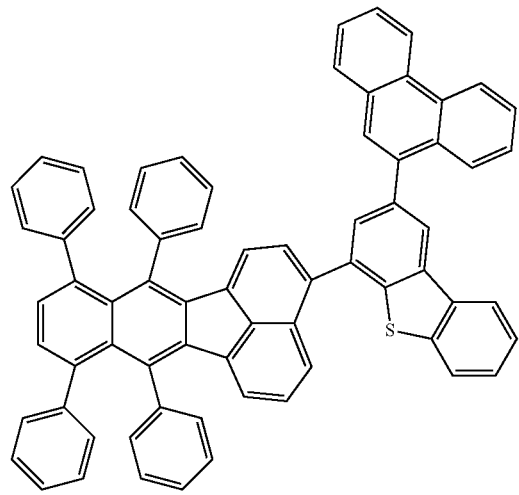
E12
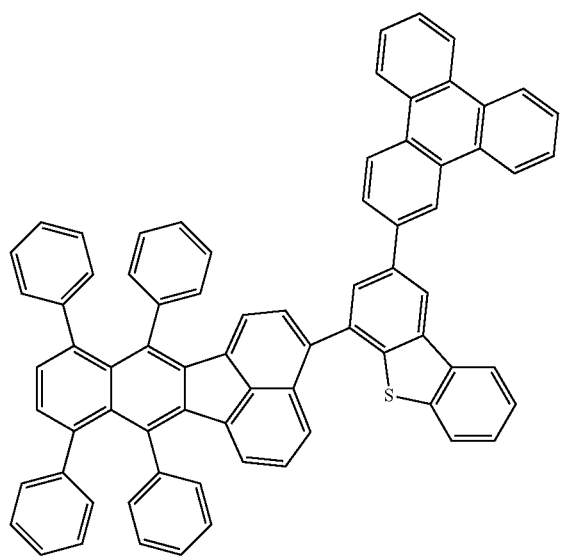
E13
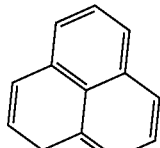
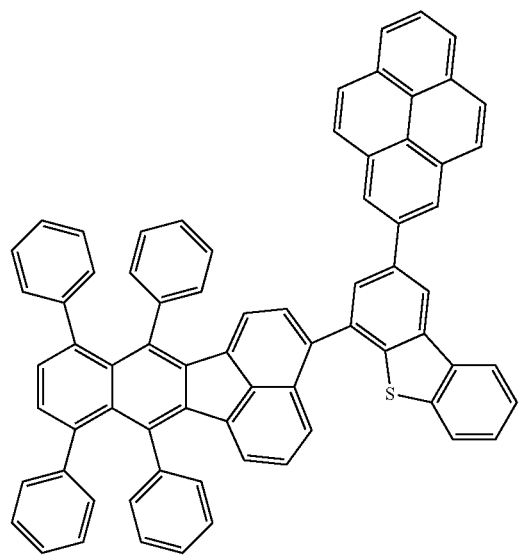
E14
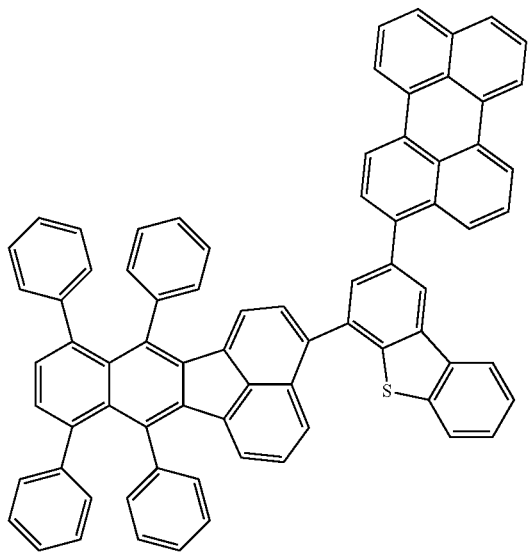
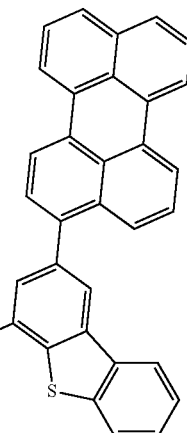
E15
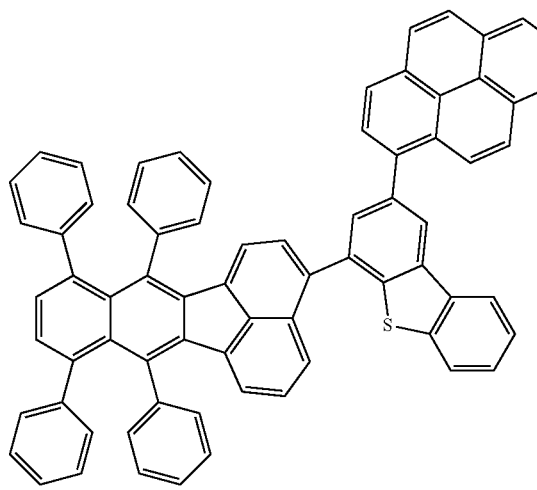
E16
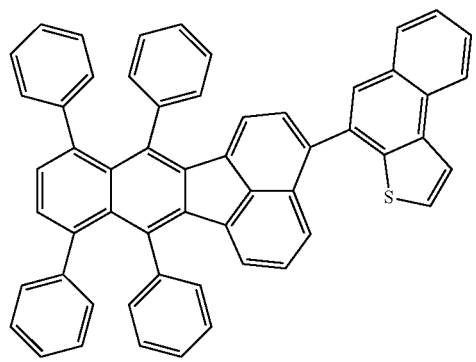

E17
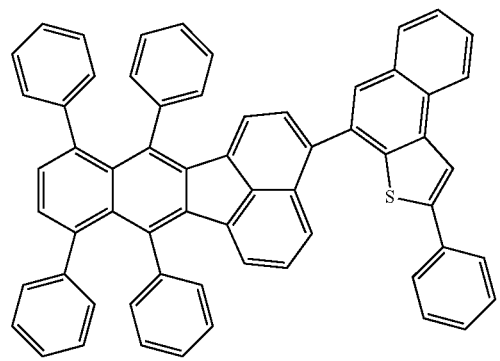
E18
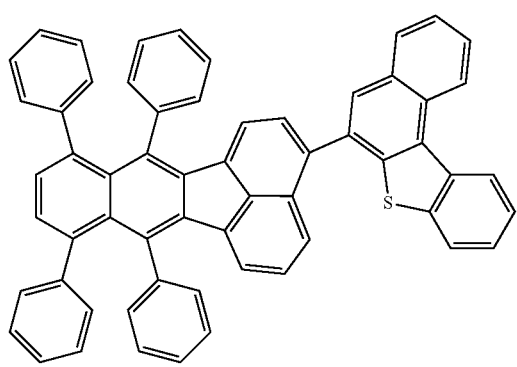
E19
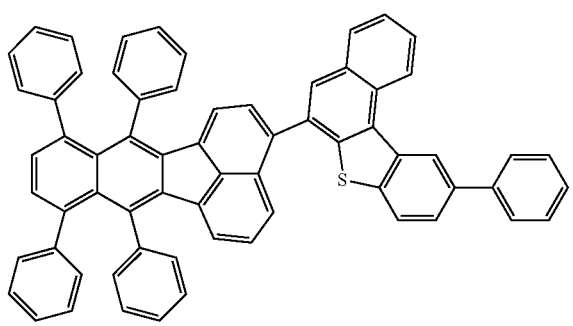
E20
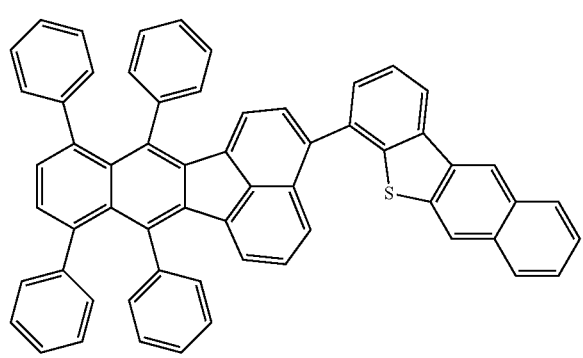
E21
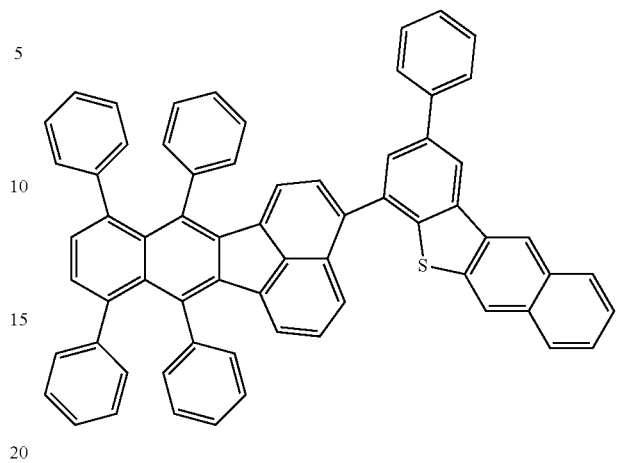
E22
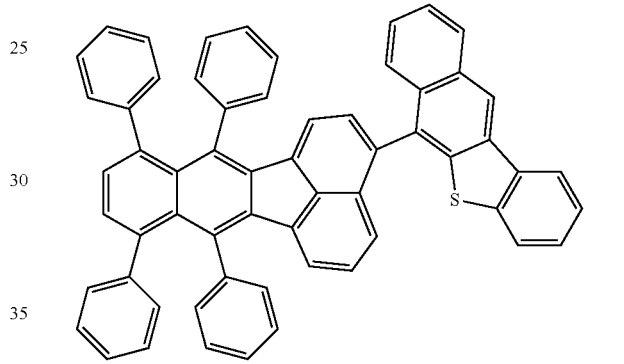
E23
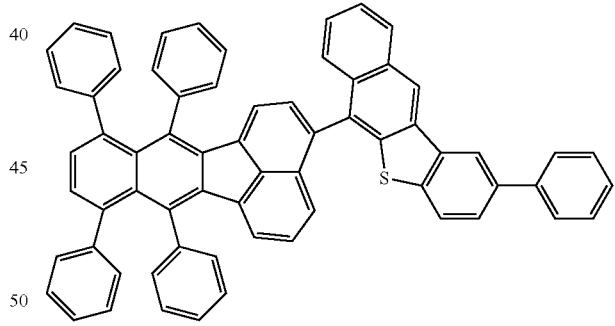
E24
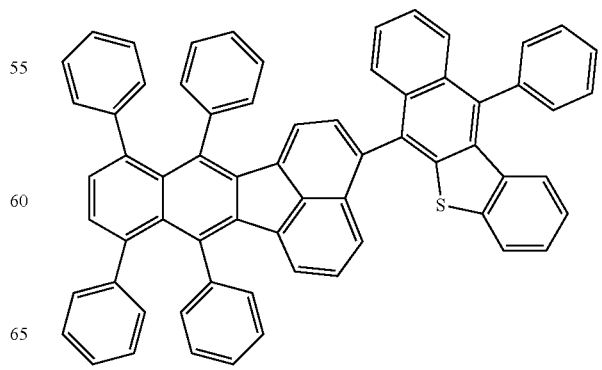

F1
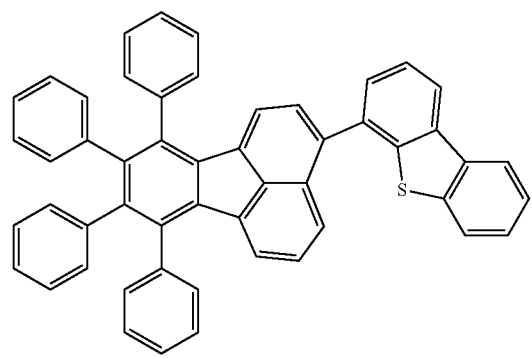
F2
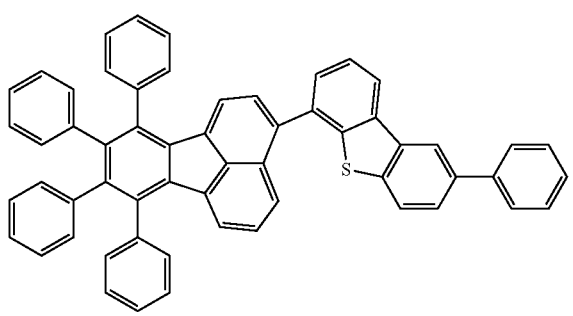
F3
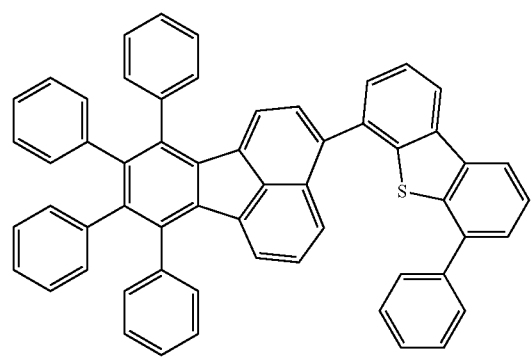
F4
F5
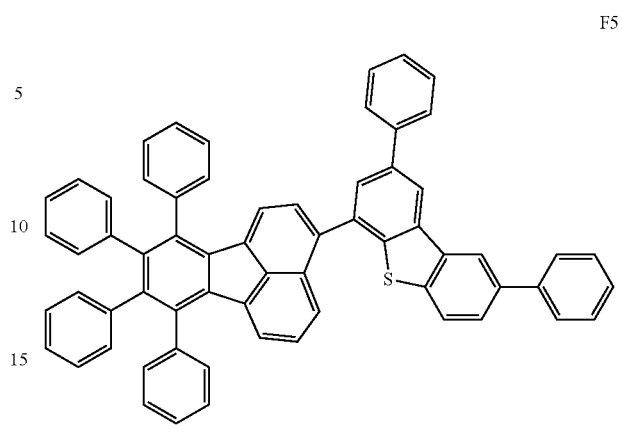
F6
F7
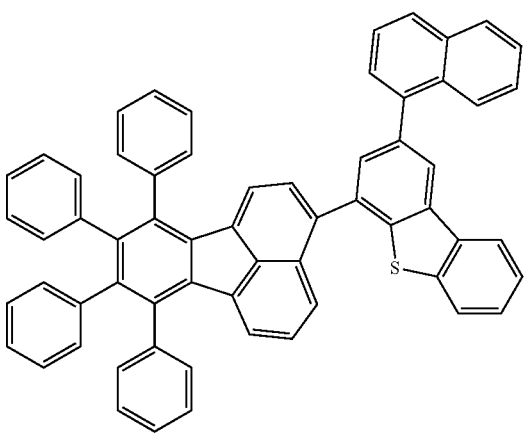

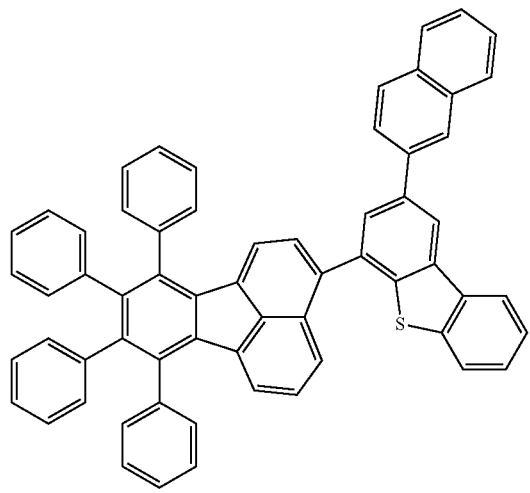
F8
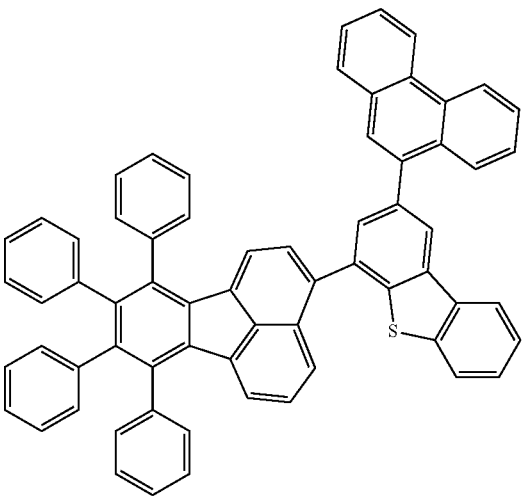
F11
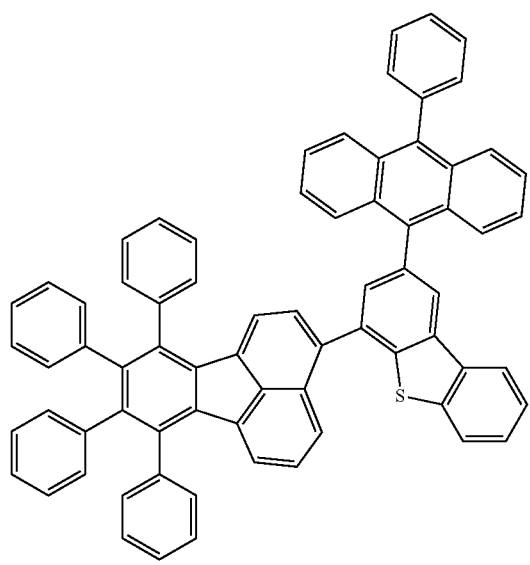
F9
F10
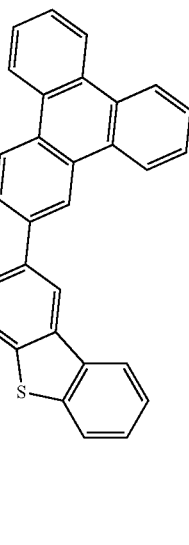
F12
F13

F14
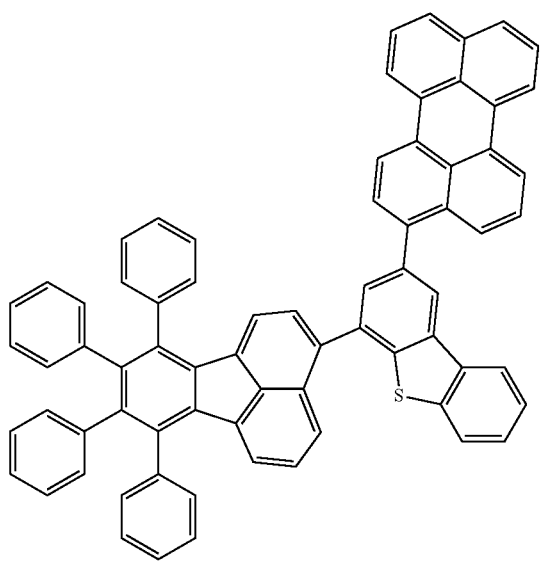
F15
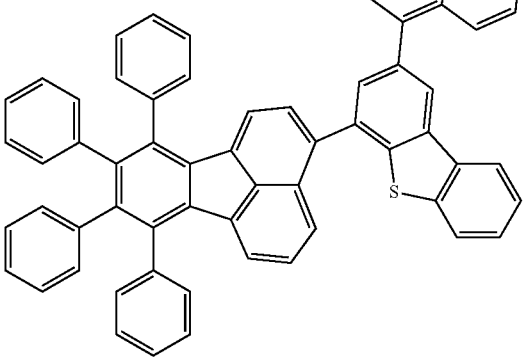
F16
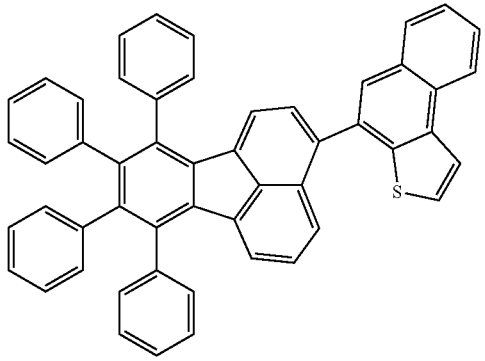
F17
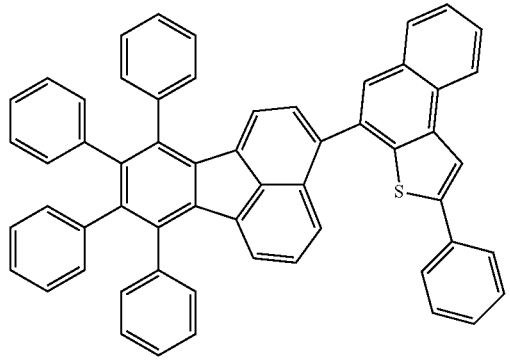
F18
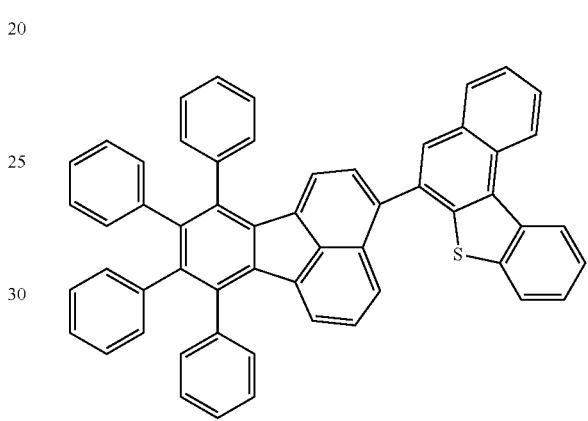
F19
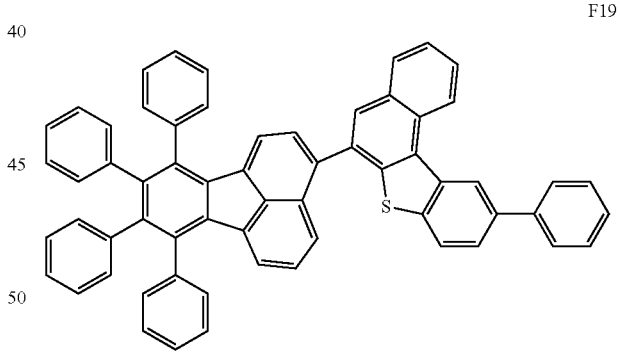
F20
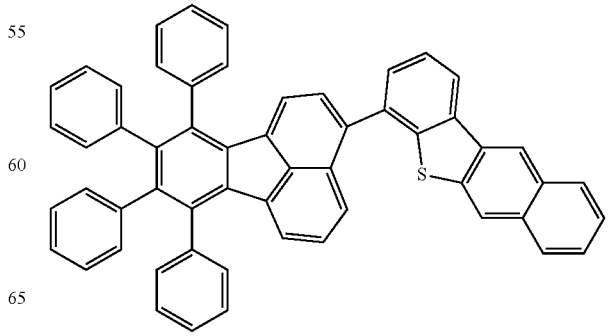

-continued
F21
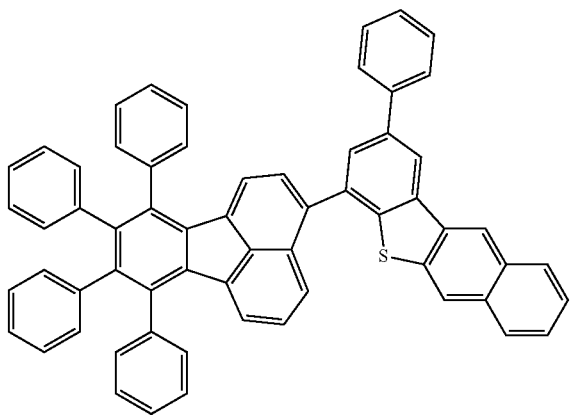
F22
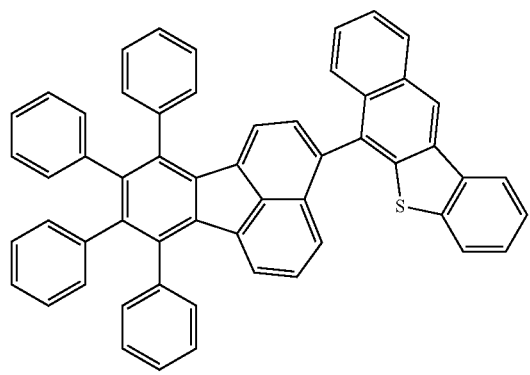
F23
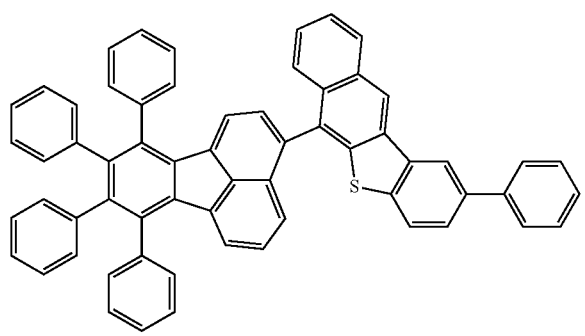
F24
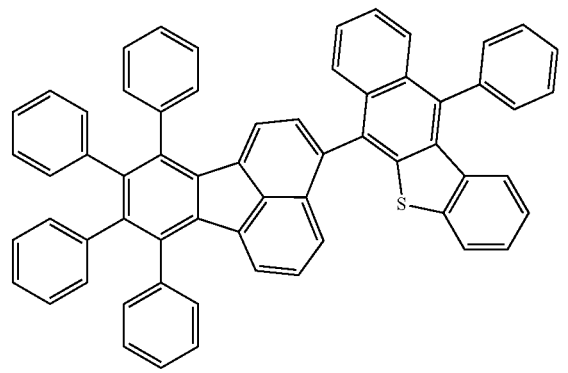
-continued
G1
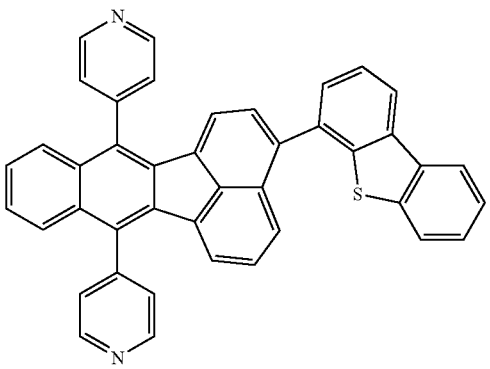
G2
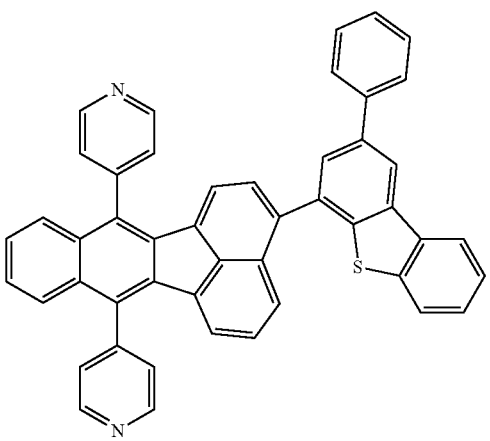
G3
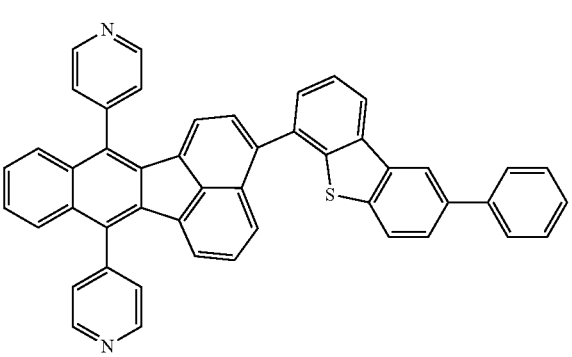
G4
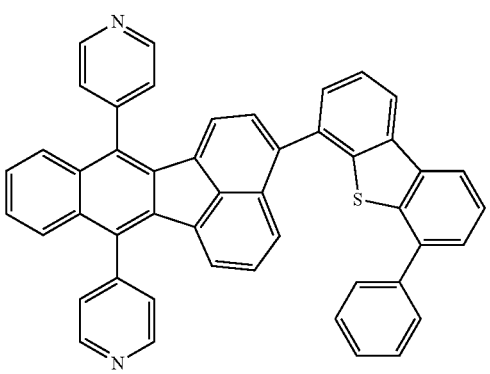

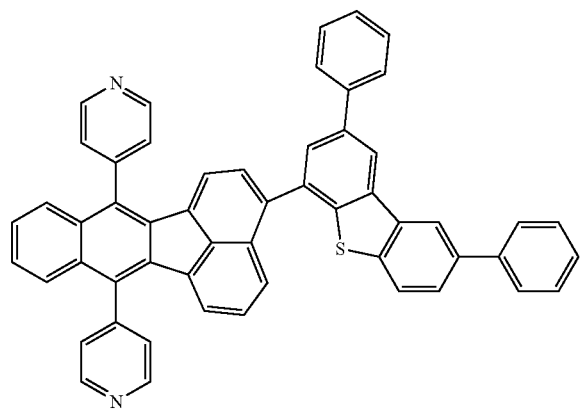
G5
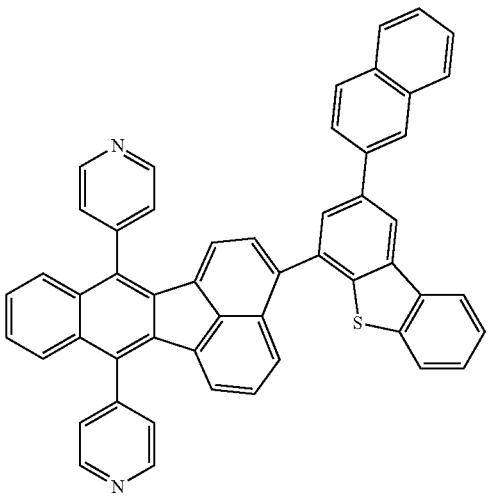
G8
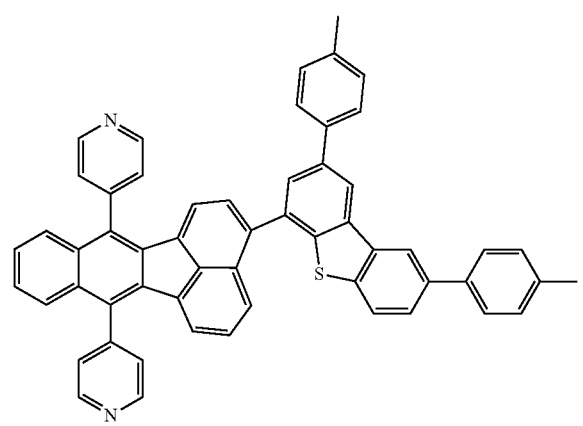
G6
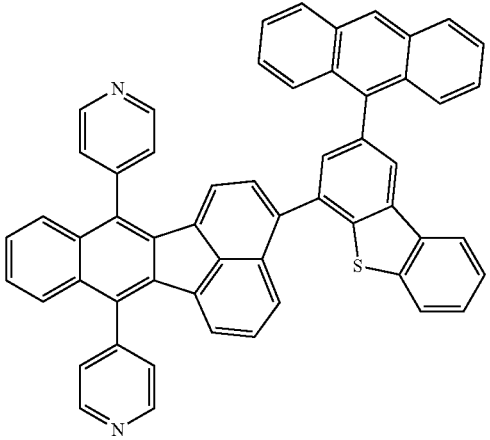
G9
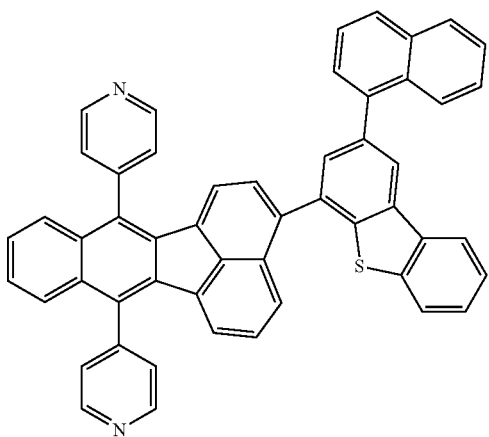
G7
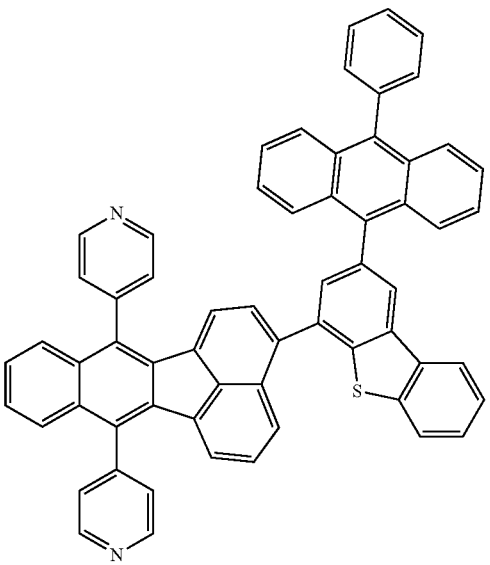
G10

G11
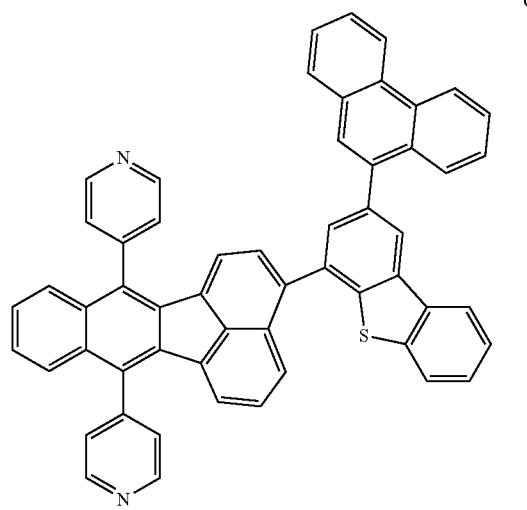
G12
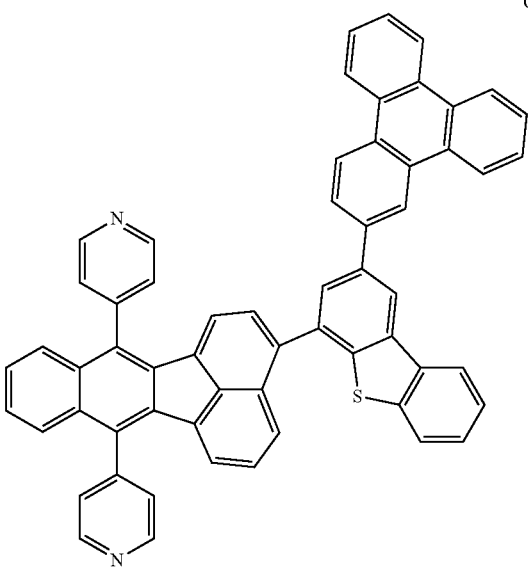
G13
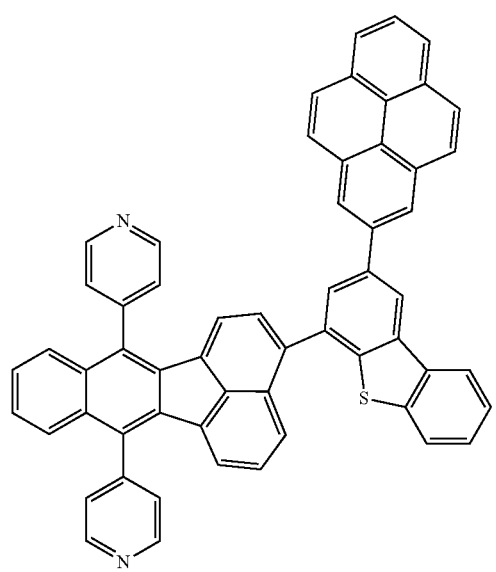
G14
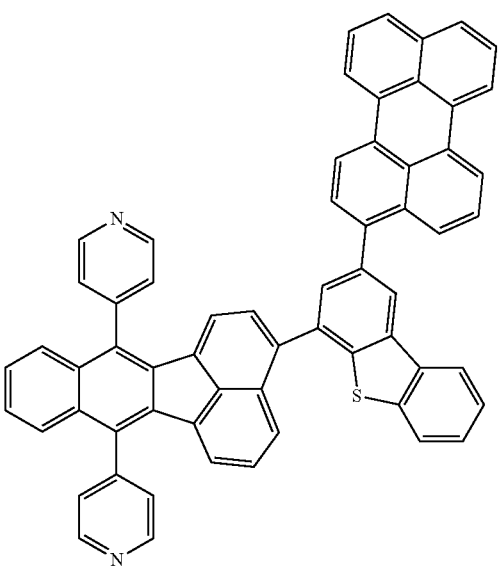
G15
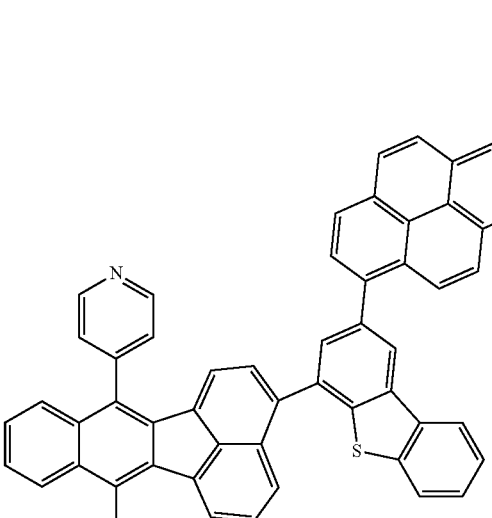
G16
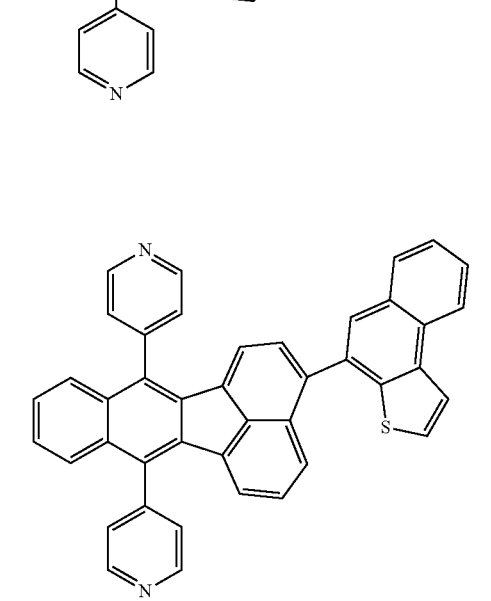

-continued
G17
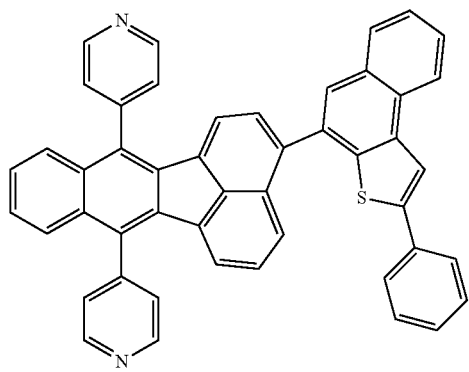
G18
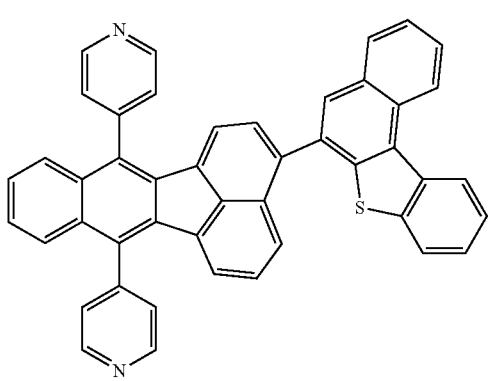
G19
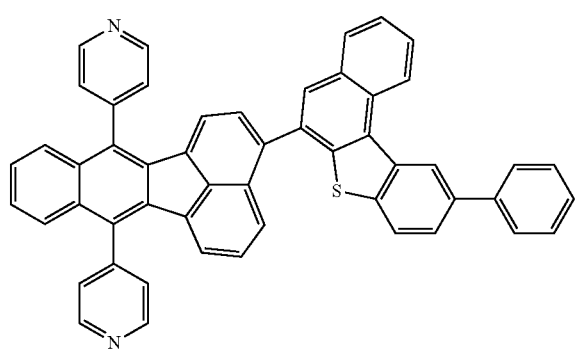
G20
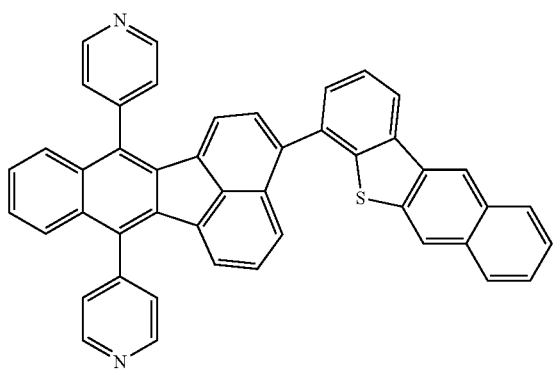
-continued
G21
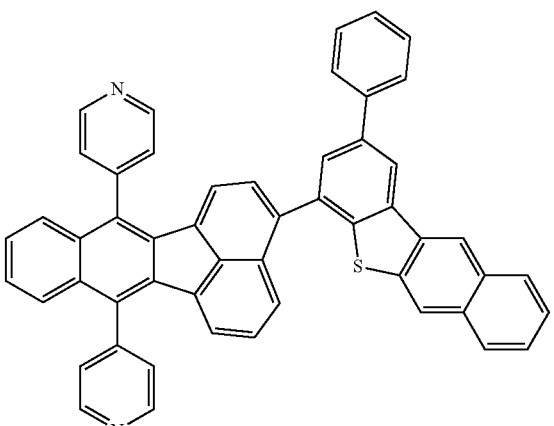
G22
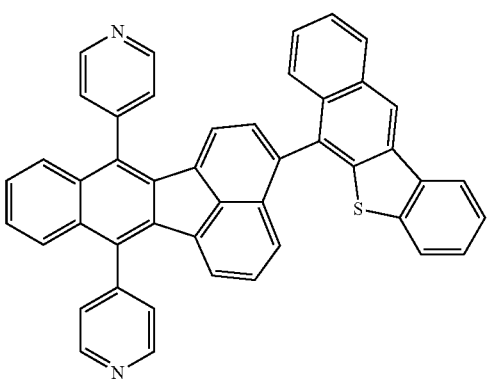
G23
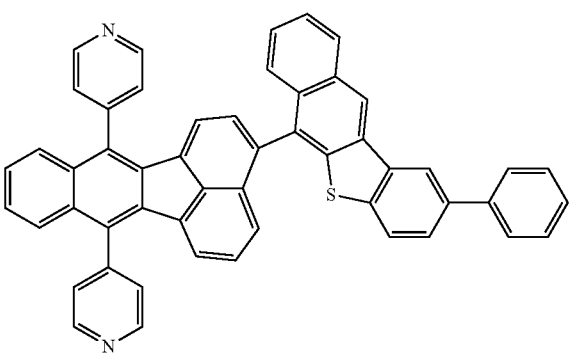
G24
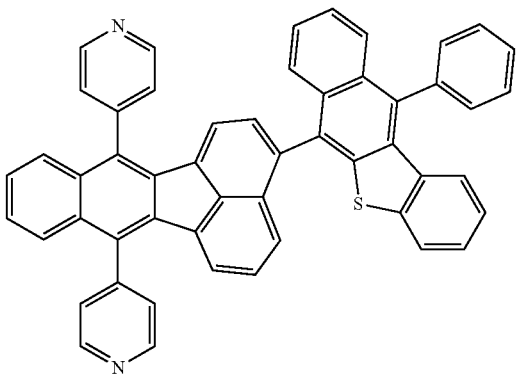

-continued
H1
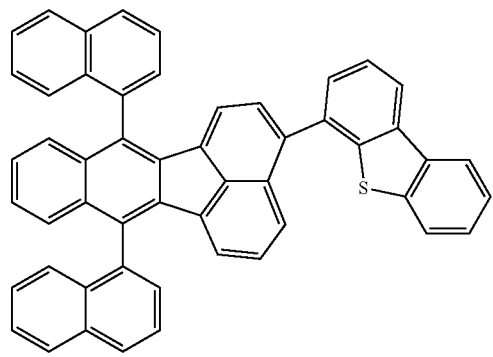
H2
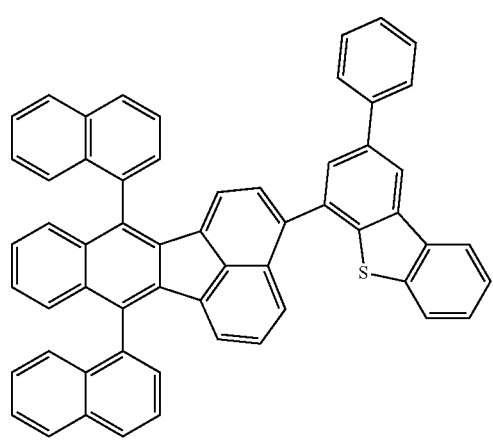
H3
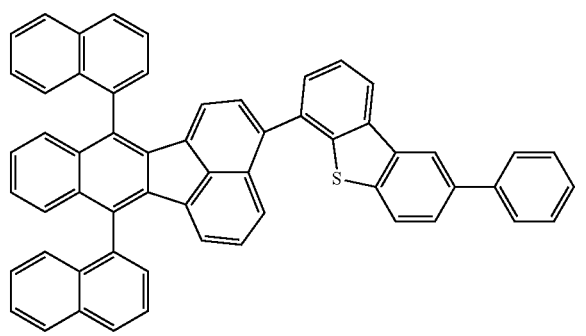
H4
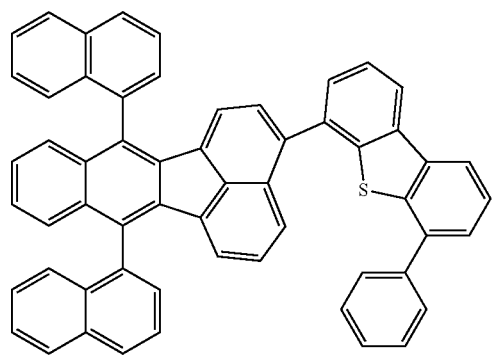
-continued
H5
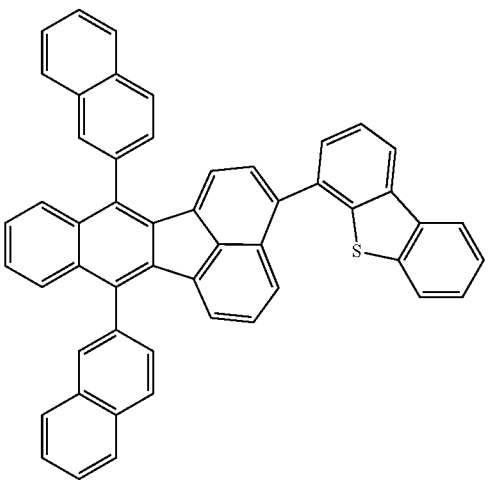
H6
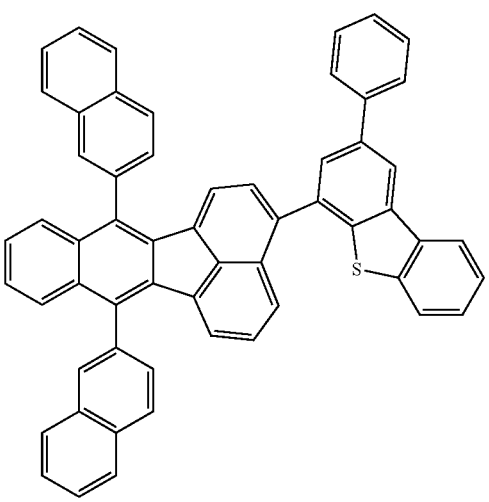
H7
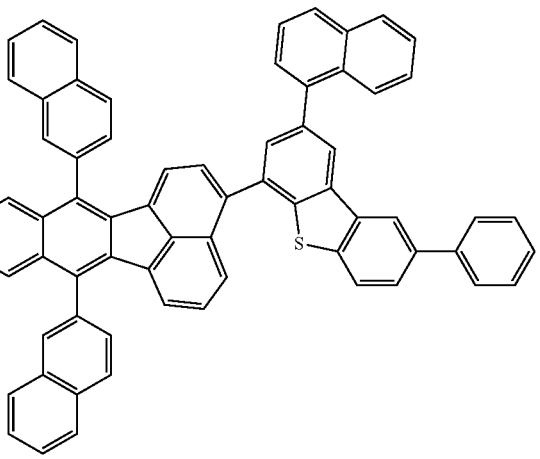

61
-continued
H8
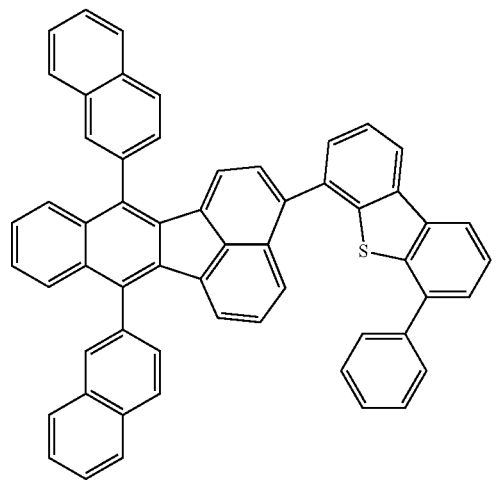
H9
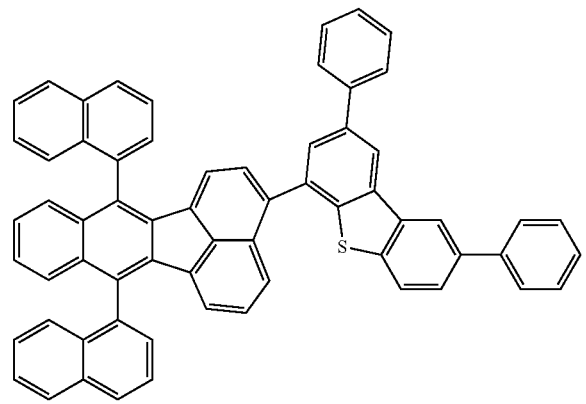
H10
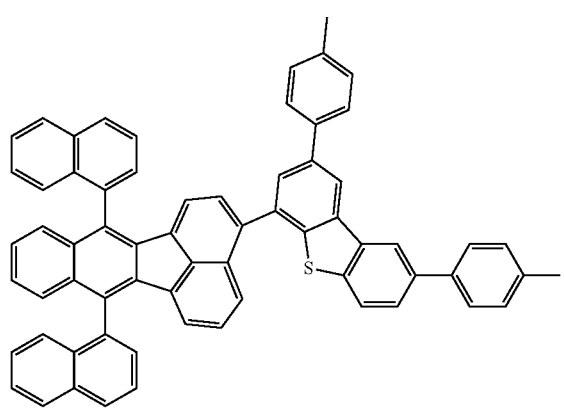
62
-continued
H11
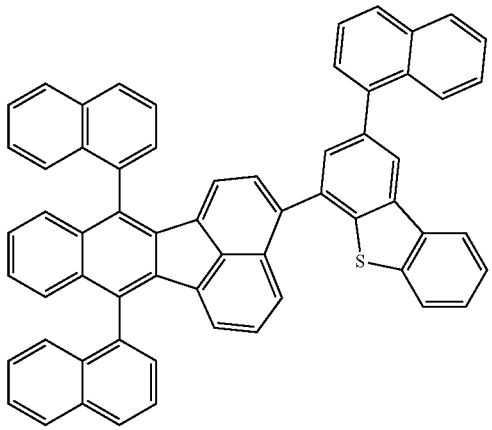
H12
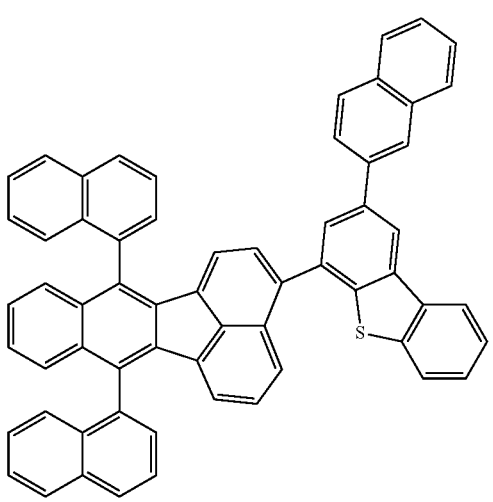
H13
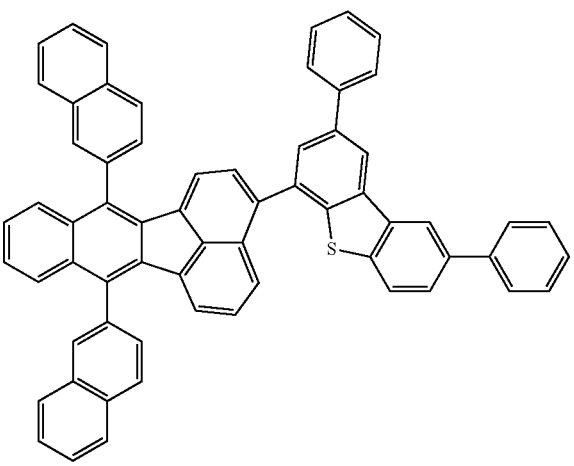

H14
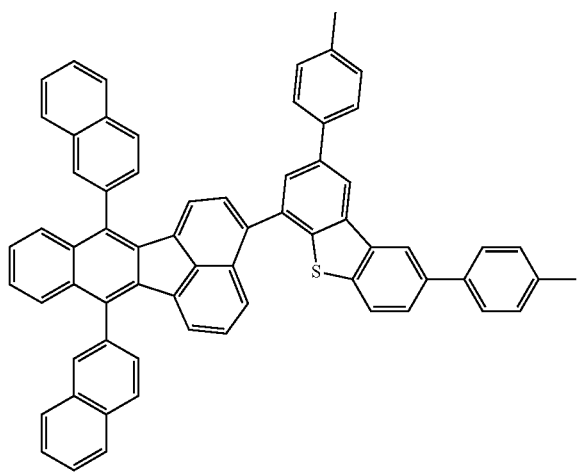
H15
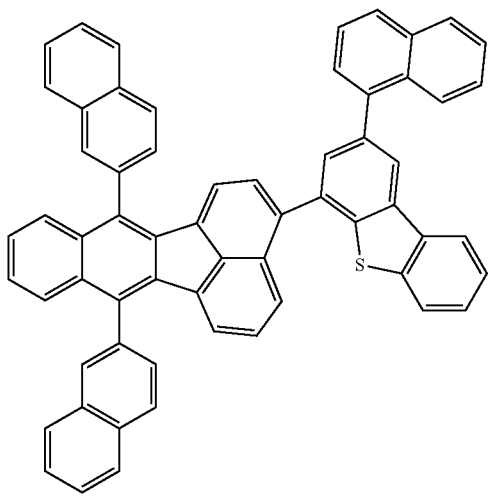
H16
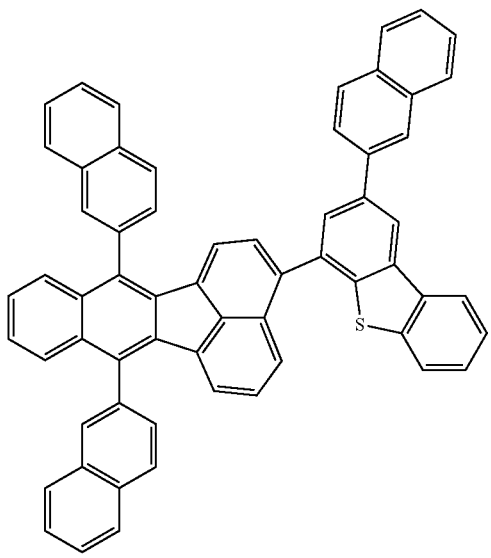
H17
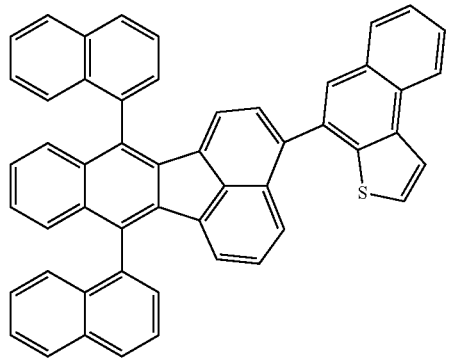
H18
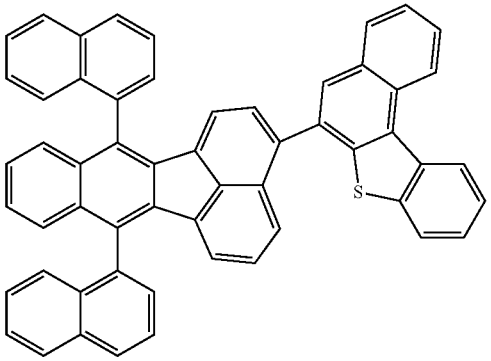
H19
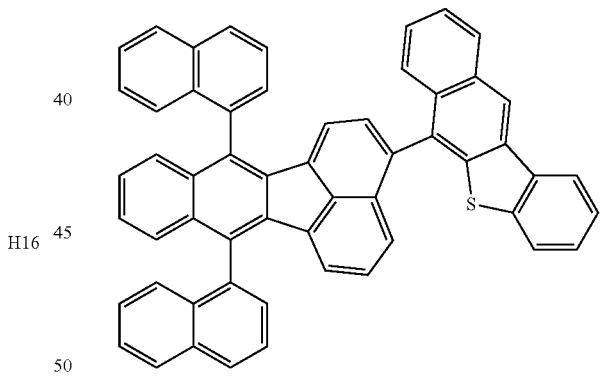
H20
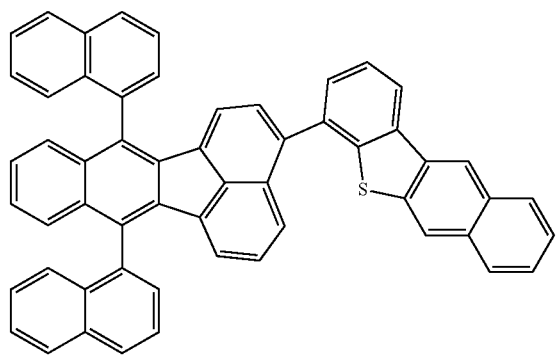

H21

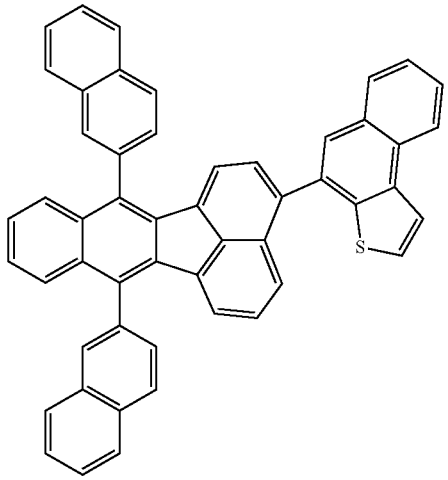

H22

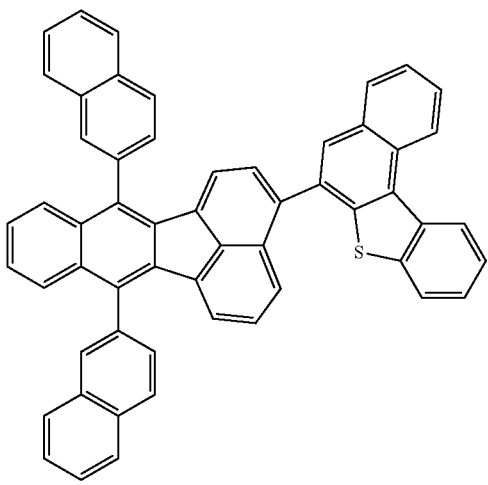

H23

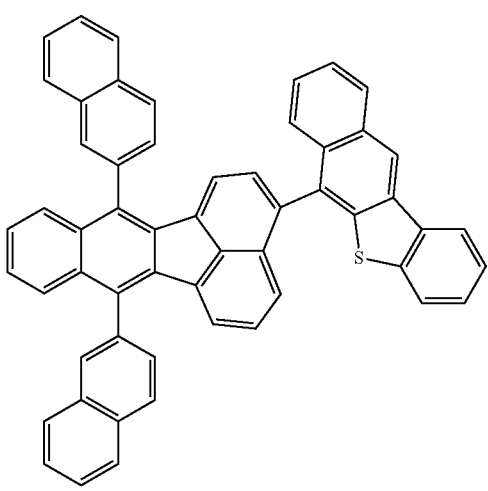

H24

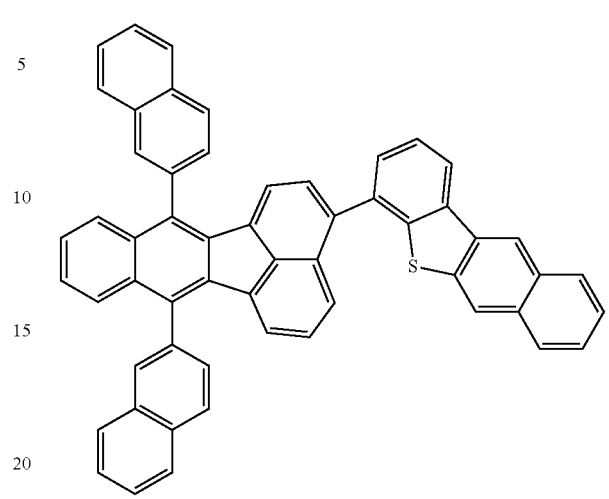

Various arylated fluoranthene derivatives may be prepared by following similar literature procedures given in Journal of the American Chemical Society 1949, vol. 71 (6), p. 1917; Journal of Nanoscience and Nanotechnology 2008, 8(9), p. 4787.

Various dibenzothiophene derivatives may be prepared by following the procedures given in the literature cited elsewhere.

One of the typical synthetic schemes to synthesize one of the exemplary Compounds A2 is given below:

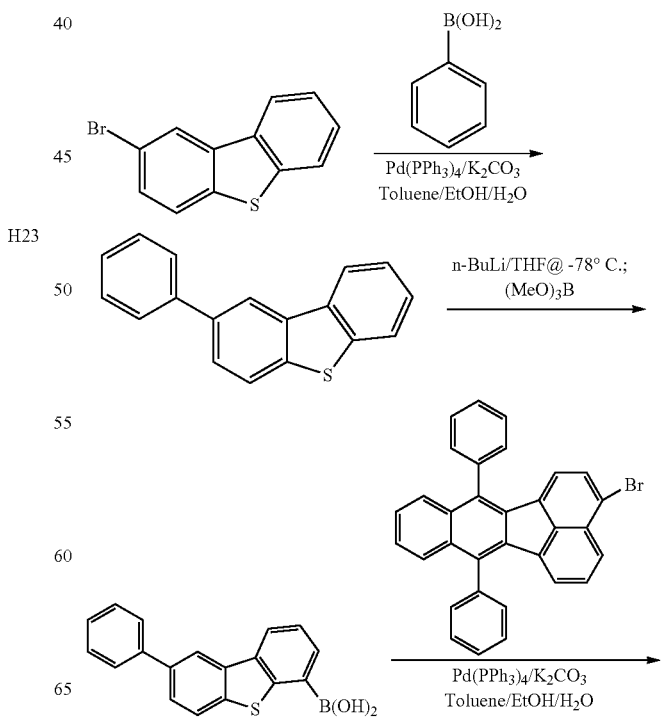

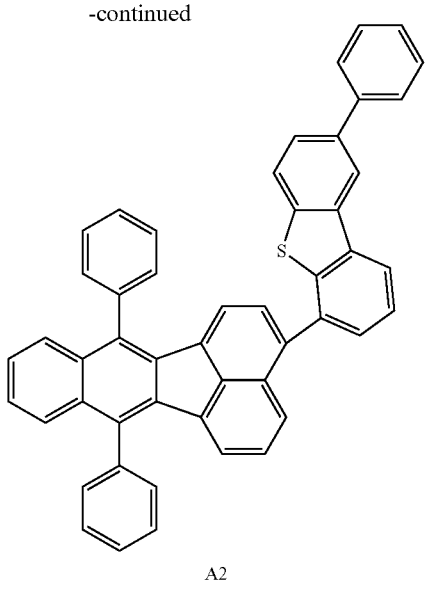

A2

The compound represented by formula (I) as previously described may be included in an organic layer of an organic electroluminescent device (EL), according to one embodiment of the present invention. Therefore the organic electroluminescent device of the present invention has at least one organic layer disposed between an anode and a cathode piled one upon another on a substrate, wherein the organic layer comprises a compound represented by the formula (I) as described earlier. As described herein, the organic layer may be an emitting layer, a hole bock layer, an electron transport layer, an electron injection layer or a hole transport layer. The organic layer including the compound represented by the formula (I) may preferably be included in the electron transport/injection layer, and in combination with electrically injecting dopants (n/p type).

Electrically conducting (i.e., n/p type) dopants to be used in the electron transport layer are preferably organic alkali/alkaline metal complexes, oxides, halides, carbonates, phosphates of alkali/alkaline group metals containing at least one metal selected from lithium and cesium. Such organic metal complexes are known in the aforementioned patent documents and elsewhere and a suitable complex can be selected from them and used in this invention.

The content of the aforementioned electrically injecting dopant in the electron transport/electron injection layer is preferably in the range of 25 wt % to 75 wt %.

Further, the compound represented by any of formula (I) may be included in the layer between emitting layer and electron transport layer. The emitting layer may include fluorescent and phosphorescent dopants and their corresponding fluorescent and phosphorescent host emitters, respectively.

Furthermore, the compounds represented by any of formulae (I) to (XIII) may be used in an electron injecting/transporting layer or hole blocking layer and/or electron blocking layer.

The structure of the organic electroluminescent device of this invention will be explained with reference to the drawing, but not limited thereto.

Figure 2:
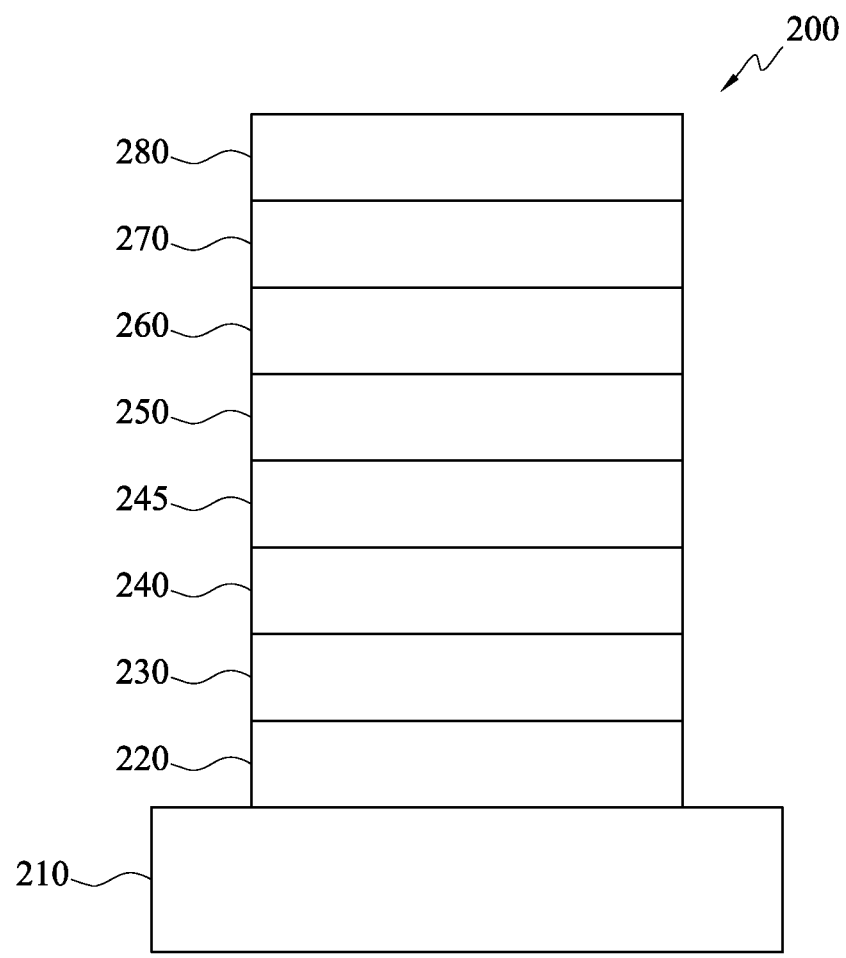
FIG. 2 is a cross-sectional view illustrating an organic light emitting device according to another embodiment of the present invention.
Figure 3:
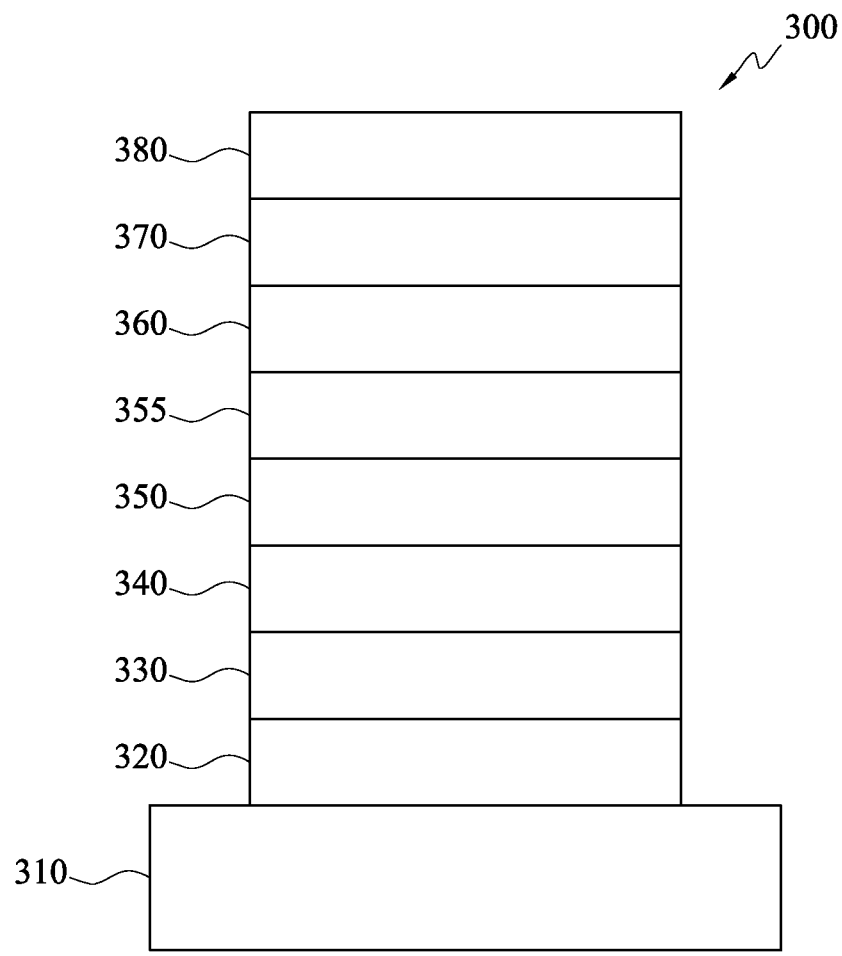
FIG. 3 is a cross-sectional view illustrating an organic light emitting device according to yet another embodiment of the present invention.

FIG. 1 is a schematic view showing an organic light emitting device according to an embodiment of the present invention. An organic light emitting device 100 includes a substrate 110, an anode 120, a hole injection layer 130, a hole transport layer 140, an emissive layer 150, an electron transport layer 160, an electron injection layer 170, and a cathode 180. The organic light emitting device 100 may be fabricated by depositing the layers described in order. FIG. 2 a schematic view showing an organic light emitting device according to another embodiment of the present invention, which is similar to that of FIG. 1. However, in the organic light emitting device of FIG. 2, an exciton 245 is interposed between a hole transport layer 240 and a light emitting layer 250. FIG. 3, which is schematic view showing an organic light emitting device according to yet another embodiment of the present invention, is also similar to FIG. 1, except for an exciton block layer 355 interposed between a light emitting layer 350 and an electron transport layer 360.

Materials used in hole injection layer, hole transport layer, electron blocking layer, hole blocking layer, light emitting layer, electron injecting layer may those conventionally used. For example, an electron-transporting material for forming the electron-transporting layer differs from that for forming the light emitting layer, and has hole-transporting properties, so as to facilitate hole mobility in the electron-transporting layer, and to prevent accumulation due to the difference in ionization potential between the light emitting layer and the electron-transporting layer.

In addition, U.S. Pat. No. 5,844,363 discloses a flexible and transparent substrate-anode combination. An example of a p-doped hole transport layer is m-MTDATA doped with $F_4$-TCNQ at a molar ratio of 50:1, as disclosed in US Patent Application Publication No. 20030230980. An example of an n-doped electron transport layer is BPhen doped with Li at a molar ratio of 1:1, as disclosed in US Patent Application Publication No. 20030230980. U.S. Pat. Nos. 5,703,436 and 5,707,745 disclose examples of cathodes including compound cathodes having a thin layer of metal such as Mg:Ag with an overlying transparent, electrically-conductive, sputter-deposited ITO layer. The theory and use of blocking layers is described in U.S. Pat. No. 6,097,147 and US Patent Application Publication No. 20030230980, which are incorporated by reference in their entireties. Examples of injection layers are provided in US Patent Application Publication No. 20040174116. A description of protective layers may be found in US Patent Application Publication No. 20040174116.

Structures and materials not specifically described may also be used, such as OLEDs comprised of polymeric materials (PLED) such as disclosed in U.S. Pat. No. 5,247,190. Further, OLEDs having a single organic layer may be used. OLEDs may be stacked as described in U.S. Pat. No. 5,707,745.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, organic vapor phase deposition (OVPD), such as described in U.S. Pat. No. 6,337,102, and deposition by organic vapor jet printing (OVJP), such as described in U.S. patent application Ser. No. 10/233,470. Other suitable deposition methods include spin coating and other solution-based processes. Solution-based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, and patterning associated with deposition methods such as ink-jet and OVJD. Certainly, other methods may be used. The materials to be deposited may be modified to make them compatible with a particular deposition method.

An organic electroluminescent device of this invention is applicable to a single device, a device with its structure arranged in array, or a device having the anode and the cathode arranged in an X-Y matrix. The present invention significantly improves luminous efficiency and driving stability of an organic electroluminescent device over the conventional devices, when used in combination of phosphorescent dopants in the light emitting layer, and furthermore the organic electroluminescent device of the present invention can perform better when applied to full-color or multicolor panels.

EXAMPLES

This invention will be described in more detail below with reference to the examples; however, it will not be limited to these examples.

Synthesis Example 1

Synthesis of Compound A1

3-bromo-7,12-diphenylbenzo[k]fluoranthene (6 g) and 4-dibenzothiophenyl boronic acid (3.2 g) were stirred together in 30 ml of toluene. 0.06 g of tetrakis(triphenylphosphine)palladium, 6.0 g of potassium carbonate and 15 ml of aqueous ethanol were added thereto, and refluxed under nitrogen for 6 h. The reaction was quenched with water, and the toluene layer was removed and passed through a celite column.

The organic layers were combined and then evaporated in a rotary evaporator under vacuum to yield compound A1 as a light yellow solid.

Compound A1 showed a melting point of 307° C. and a glass transition temperature of 176° C.

The major UV absorption peaks of Compound A1 were 313 nm, 394 nm, and 417 nm.

The photoluminescence spectrum of Compound A1 showed an emission at 435 nm.

Figure 4:
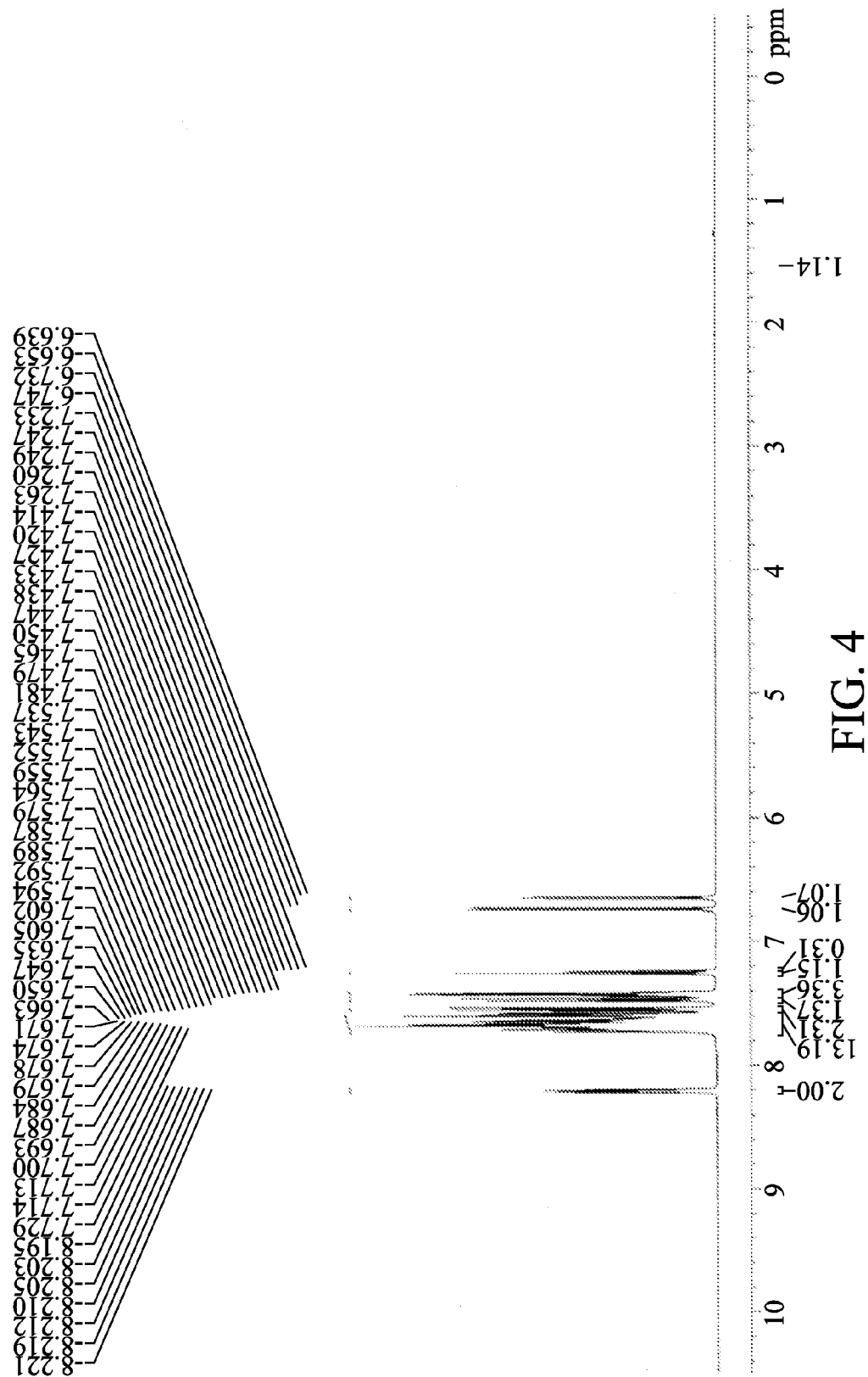
FIG. 4 shows the $^1$H-NMR spectrum of Compound A1.

$^1$H-NMR spectrum of Compound A1 is shown in FIG. 4

$^1$H NMR (CDCl$_3$, δ): 8.21 (dd, 1H) –8.20 (dd, 1H); 7.72-7.57 (m, 14H); 7.56-7.54 (m, 3H); 7.48 (d, 1H); 7.45-7.41 (m, 3H); 7.27-7.23 (m, 1H); 6.74 (d, 1H); 6.65 (d, 1H).

Synthesis Example 2

Synthesis of Compound A2

2-bromo-dibenzo[b,d]thiophene (10 g), phenylboronic acid (5.1 g) tetrakis(triphenylphosphine)palladium (2.2 g) and potassium carbonate (18.38 g) were refluxed in a mixture of toluene (110 mL), ethanol (20 mL) and water (90 mL) overnight. The reaction was quenched with water and the toluene layer was removed and passed through a celite column and the toluene layer was evaporated in a rotary evaporator to yield 5.2 g 2-phenyl-dibenzo[b,d]thiophene. 2-phenyldibenzo[b,d]thiophene (5.2 g) was dissolved in anhydrous tetrahydrofuran (50 mL) under nitrogen atmosphere, and the solution was then cooled to –78° C. 20.0 mL of n-butyl lithium (1.6 M solution) was added dropwise into the reaction mixture, and continuously stirred to equilibriate to room temperature. The reaction mixture was then cool to –60° C., and trimethyborate (5.67 mL) was added and the reaction was allowed to stir overnight. The reaction was then quenched with 20% aqueous hydrochloric acid, and extracted the organic layer with ethyl acetate; ethyl acetate layer was then washed thoroughly with water and dried over anhydrous sodium sulfate, and was evaporated to dryness to yield 4.2 g of 8-phenyldibenzo[b,d]thiophene-4-boronic acid.

3-bromo-7,12-diphenylbenzo[k]fluoranthene, (4.63 g), prepared by procedures known in the art, and 8-phenyl dibenzo[b,d]thiophene-4-boronic acid (3.5 g) were stirred together in 50 ml of toluene. 0.553 g of tetrakis(triphenylphosphine)palladium, 4.62 g of potassium carbonate, and 50 mL of aqueous ethanol were added thereto, and refluxed under nitrogen. The reaction was monitored by thin layer chromatography for 6 h. The reaction was quenched with water and the toluene layer was further extracted with water and was passed through a silica gel column chromatography. The organic layers were combined and then evaporated in a rotary evaporator under vacuum to yield 3.5 g of Compound A2 as a yellow-white solid.

Compound A2 did not show any observable melting point. Compound A2 showed a uv-vis absorption peaks at 395, 417 nm, and its photoluminescence in tetrahydrofuran showed an emission peak at 440 nm.

Figure 5:
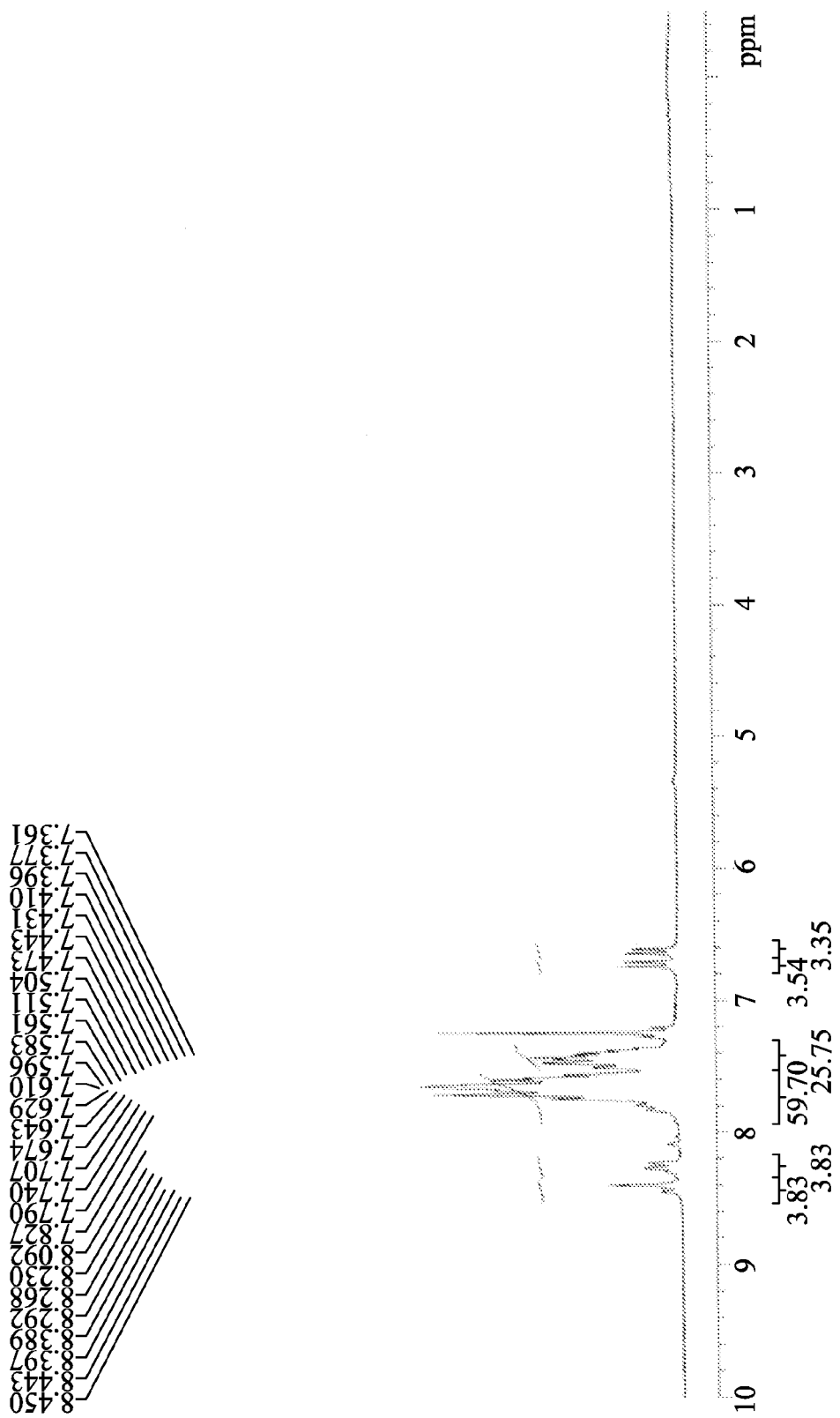
FIG. 5 shows the $^1$H-NMR spectrum of Compound A2.

$^1$H-NMR of compound A2 is shown in FIG. 5.

$^1$H NMR (CDCl$_3$, δ): 8.45-8.39 (m, 1H); 8.25 (dd, 1H); 7.83-7.56 (m, 17H); 7.51-7.36 (m, 8H); 7.27-7.24 (m, 1H); 6.73 (d, 1H); 6.63 (d, 1H).

Synthesis Example 3

Synthesis of compound A5

2,8-dibromo-dibenzo[b,d]thiophene (14 g), phenylboronic acid (11.0 g) tetrakis(triphenylphosphine)palladium (3.8 g) and potassium carbonate (20 g) were refluxed together in a mixture of toluene (110 mL), ethanol (20 mL) and water (90 mL) overnight. The reaction was quenched with water and the toluene layer was removed and passed through a celite column and the toluene layer was evaporated in a rotary evaporator to yield 6.0 g 2,8-diphenyl-dibenzo[b,d]thiophene.

2,8-diphenyldibenzo[b,d]thiophene (6.0) was dissolved in anhydrous tetrahydrofuran (80 mL) under nitrogen atmosphere and the solution was then cooled to –78° C. 20.0 mL of n-butyl lithium (1.6 M solution) was added dropwise into the reaction mixture and continuously stirred to equilibrate to room temperature. The reaction mixture was then cool to –60° C. and trimethyborate (5.67 mL) was added and the reaction was allowed to stir overnight. The reaction was then quenched with 20% aqueous hydrochloric acid, and extracted the organic layer with ethyl acetate; ethyl acetate layer was then washed thoroughly with water and dried over anhydrous sodium sulfate, and was evaporated to dryness to yield 4.5 g of 2,8-diphenyldibenzo[b,d]thiophene-4-boronic acid.

3-bromo-7,12-diphenylbenzo[k]fluoranthene, (3.8 g), prepared by procedures known in the art, and 2,8-diphenyldibenzo[b,d]thiophene-4-boronic acid (3.5 g) were stirred together in 50 ml of toluene. 0.5 g of tetrakis(triphenylphosphine)palladium, 3.8 g of potassium carbonate, and 50 mL of aqueous ethanol were added thereto, and refluxed under nitrogen. The reaction was monitored by thin layer chromatography for 6 h. The reaction was quenched with water and the toluene layer was further extracted with water and was passed through a silica gel column chromatography. The organic layers were combined and then evaporated in a rotary evaporator under vacuum to yield 3.0 g of Compound A5 as a yellow solid.

Compound A5 showed a glass transition temperature of 194° C. Compound A5 showed a uv-vis absorption peaks at 397, 419 nm, and its photoluminescence in tetrahydrofuran showed an emission peak at 446 nm.

Figure 6:
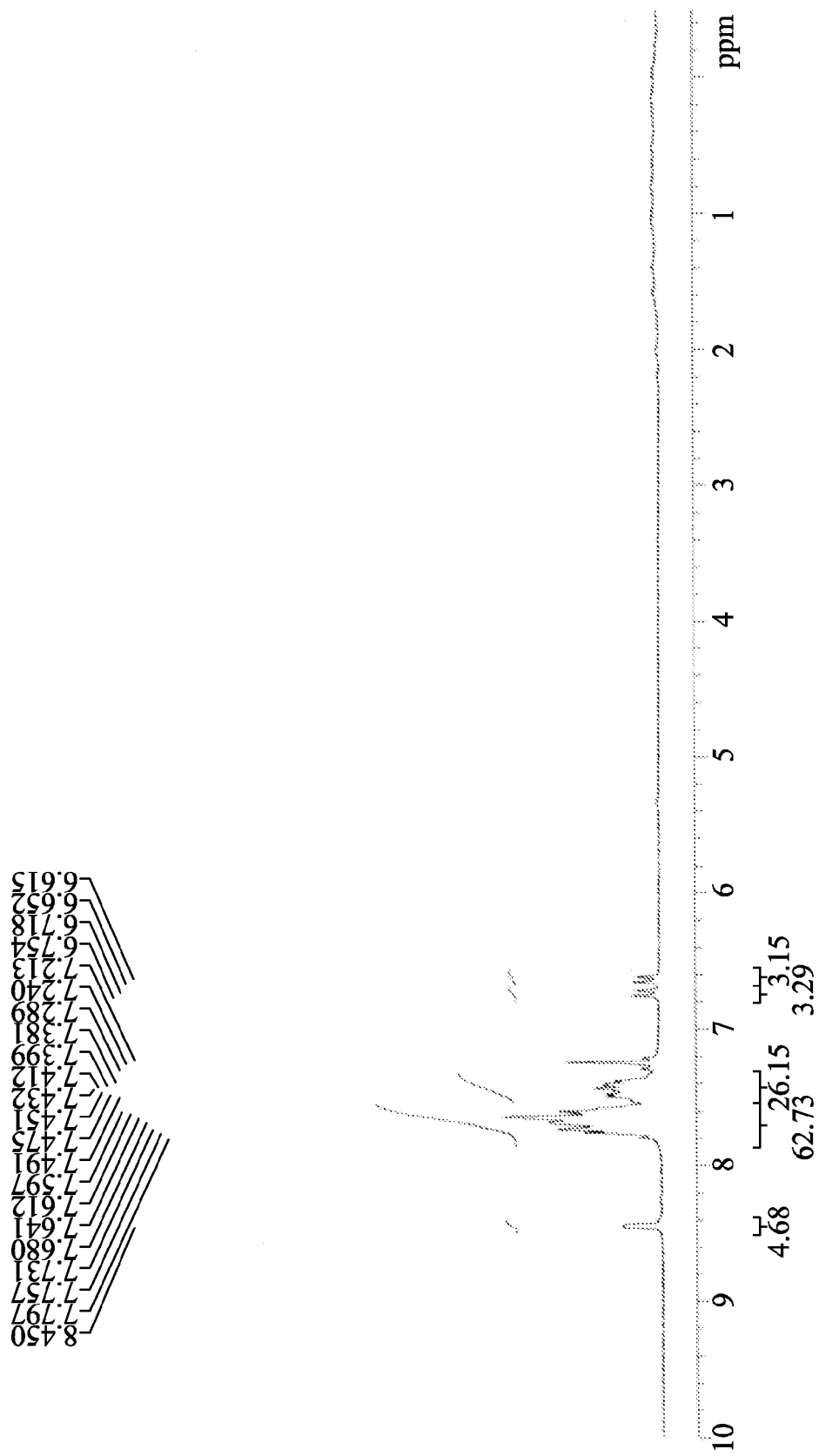
FIG. 6 shows the $^1$H-NMR spectrum of Compound A5.

¹H-NMR of compound A5 is shown in FIG. 6.

¹H NMR (CDCl₃, δ): 8.46-8.42 (m, 2H); 7.80-7.56 (m, 20H); 7.51-7.36 (m, 9H); 7.29-7.24 (m, 1H); 6.74 (d, 1H); 6.63 (d, 1H).

Device Example 1

Fabrication of Organic Electroluminescent Device

Prior to use, the substrate was degreased with solvents and cleaned in a UV ozone before it was loaded into the evaporation system. The substrate was then transferred into a vacuum deposition chamber for deposition of all other layers on top of the substrate. By evaporation from a heated boat under a vacuum of approximately $10^{-6}$ Torr, the following layers were deposited in the following sequence, as shown in FIG. 2:

a) a hole injecting layer, 30 nm thick, HAT-CN, b) a hole transporting layer, 110 nm thick, N,N'-di-1-naphthyl-N,N'-diphenyl-4,4'-diaminobiphenyl (NPB);

c) a light emitting layer, 30 nm thick, comprising BH doped with 3% BD by volume; (BH and BD from E-ray optoelectronics Tech Co. Ltd, Taiwan)

e) an electron transport layer, 15 nm thick, including compound A1;

f) an electron injection layer, 1 nm thick, LiF; and g) a cathode: approximately 150 nm thick, including Compound A1.

Device structure may be denoted as: ITO/HAT-CN (30 nm)/ NPB (110 nm)/BH-3% BD (30 nm)/Compound A1 (15 nm)/ LiF (1 nm)/Al (150 nm).

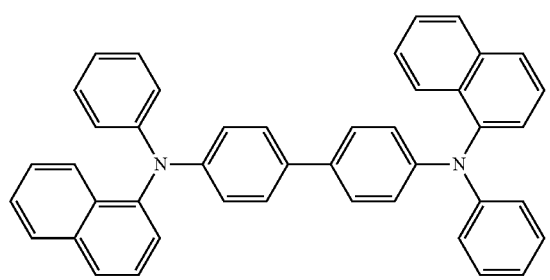

NPB

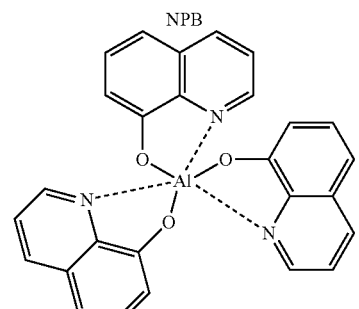

Alq3

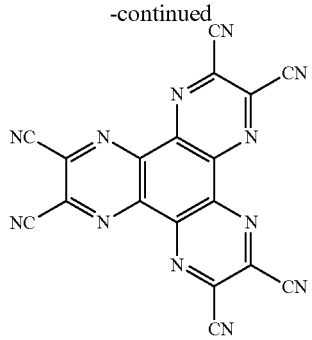

HAT-CN

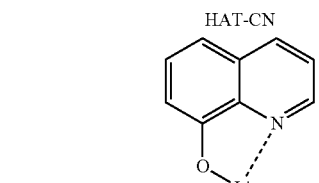

Liq

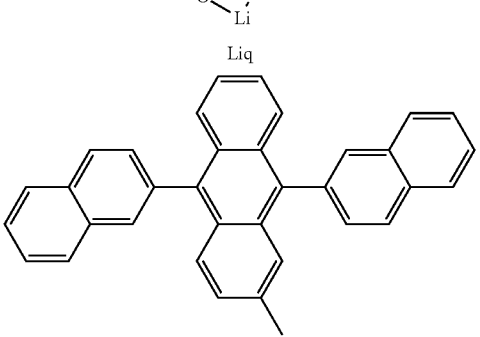

BH

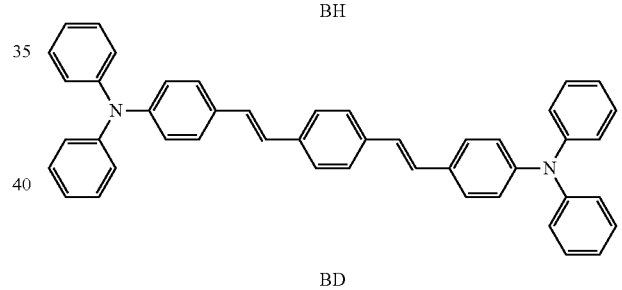

BD

After the deposition of these layers, the device was transferred from the deposition chamber into a dry box for encapsulation, and were subsequently encapsulated using an UV-curable epoxy and a glass lid containing a moisture getter. The organic EL has an emission area of 3 mm². The organic EL device thus obtained was connected to an outside power source, and upon application of direct current voltage, emission of light with the characteristics shown in Table 2 was confirmed.

The EL characteristics of all the fabricated devices were evaluated using a constant current source (KEITHLEY 2400 Source Meter, made by Keithley Instruments, Inc., Cleveland, Ohio) and a photometer (PHOTO RESEARCH SpectraScan PR 650, made by Photo Research, Inc., Chatsworth, Calif.) at room temperature.

Operational lifetime (or stability) of the devices were tested at the room temperature and at various initial luminance depending on the color of the emitting layer, by driving a constant current through the devices. The color was reported using Commission Internationale de l'Eclairage (CIE) coordinates.

Device Example 2

Fabrication of Organic EL Device

Organic fluorescent EL device was fabricated similar to the layer structure as example 1, except that a n-dopant of Lithium quinoate, Liq, is used with the compound A1 in the ratio of 1:1, in the electron transport layer. The device structure may be denoted as: ITO/HAT-CN (30 nm)/NPB (110 nm)/BH-3% BD (30 nm)/Liq doped Compound A1 (15 nm)/LiF (1 nm)/Al (150 nm).

Comparative Example 1

Fabrication of Organic EL Device

Organic EL device was fabricated similar to the layer structure as example 1, except that Alq$_3$ was used in place of Compound A1 in the electron transport layer. The device structure may be denoted as: ITO/HAT-CN (30 nm)/NPB (110 nm)/BH-3% BD (30 nm)/Alq$_3$ (15 nm)/LiF (1 nm)/Al (150 nm).

Figure 7:
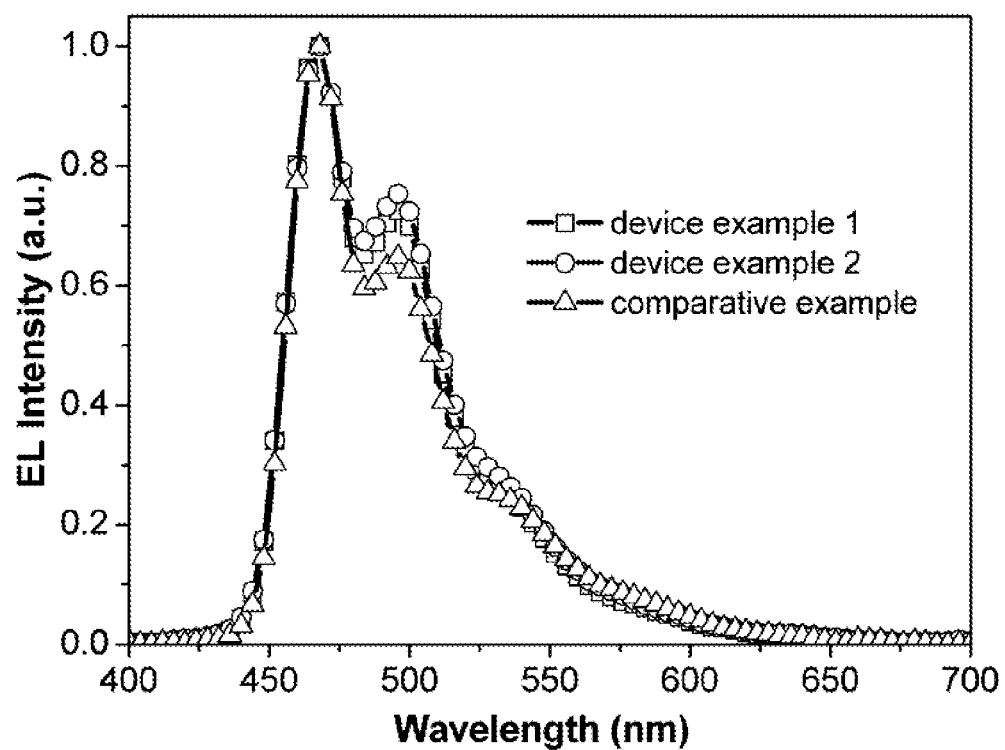
FIG. 7 shows the electroluminescent spectrum of an organic electroluminescent device according to the present invention.
Figure 8:
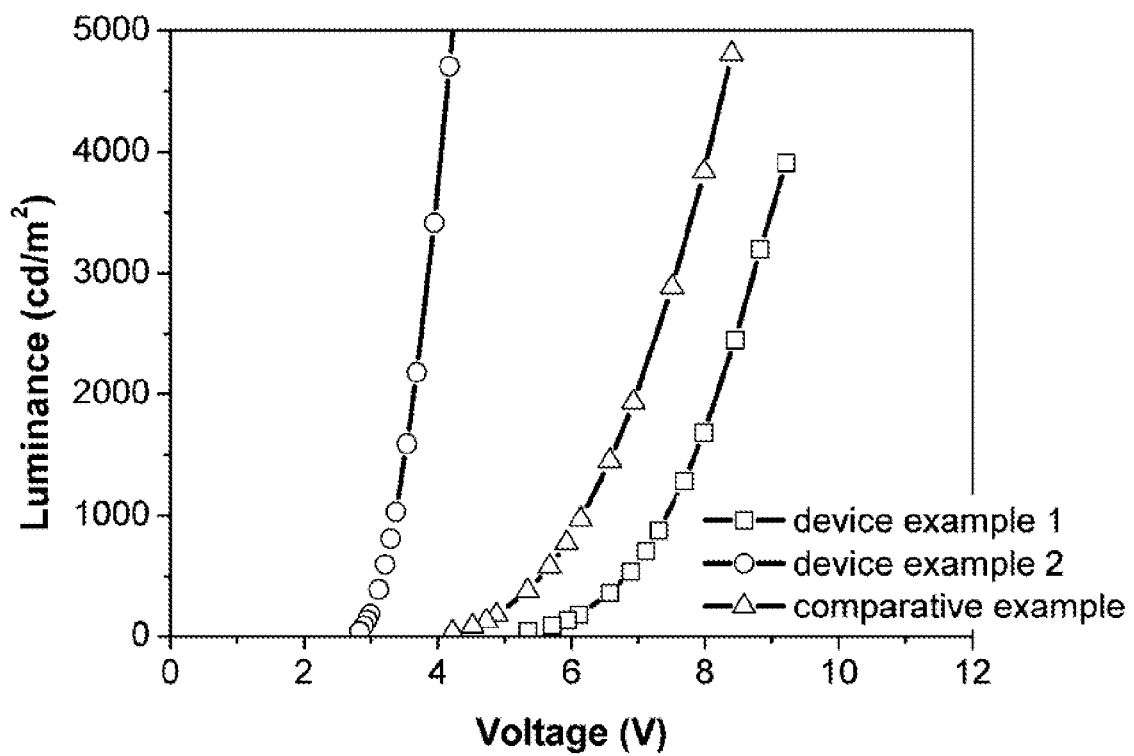
FIG. 8 shows the plot of luminance against current density of the organic electroluminescent device according to the present invention.

The peak wavelength of the emitted light, maximum luminance efficiency, driving voltage, and power efficiency of the organic EL devices fabricated in the examples are shown in Table 2. EL spectra of the device examples 1-2 are shown in FIG. 7, and a plot of voltage versus luminance is shown in FIG. 8.

TABLE 2

| | Driving voltage (V) | Peak Wavelength (nm) | Max. luminance efficiency (cd/A) @ 10 mA/cm$^2$ | $T_{50}@L_0=$ 1000 nits |
|---|---|---|---|---|
| Device Example 1 | 7.31 | 468 | 8.77 | 990 |
| Device Example 2 | 3.37 | 468 | 10.31 | 11339 |
| Comparative Example 1 | 5.53 | 468 | 9.90 | 5637 |

INDUSTRIAL APPLICABILITY

As described above in detail, the organic EL device in which the material for the EL device of the present invention is used is extremely practical because it has high luminous efficiency, high thermal stability, sufficiently low driving voltage and long lifetime. Therefore, the organic EL device of this invention is applicable to flat panel displays, mobile phone displays, light sources utilizing the characteristics of planar light emitters, sign-boards and has a high technical value.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

The invention claimed is:

1. A compound of a formula selected from the group consisting of Formula (II) to Formula (XIII):

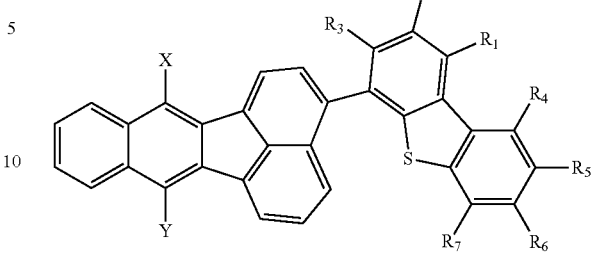

Formula II

Formula III

Formula IV

Formula V

Formula VI

-continued

Formula VII
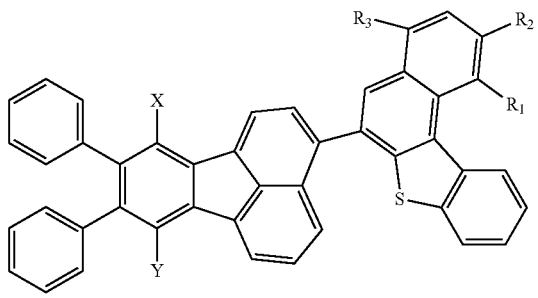

Formula VIII
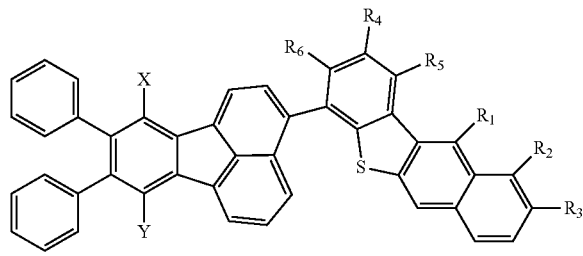

Formula IX
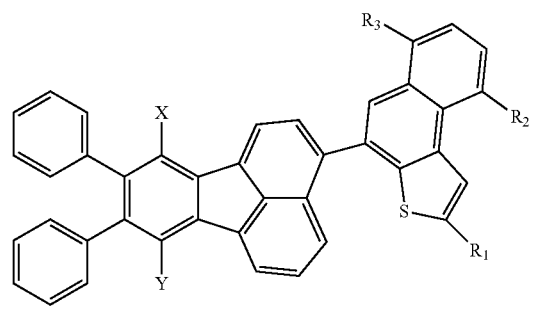

Formula X
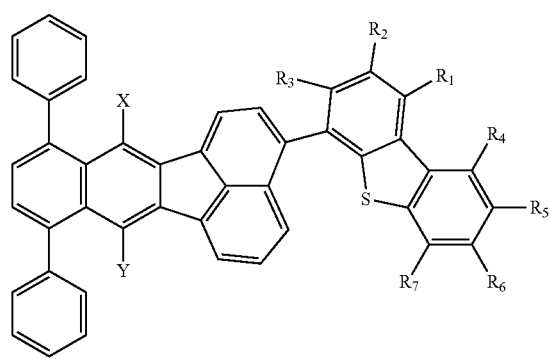

-continued

Formula XI
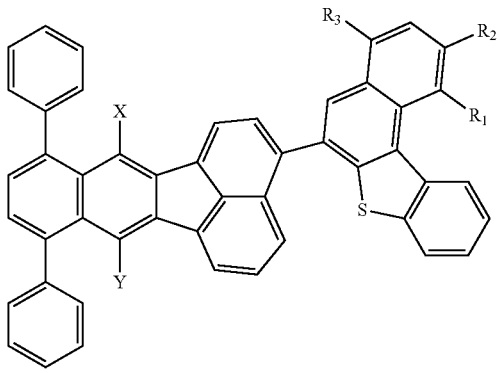

Formula XII

Formula XIII
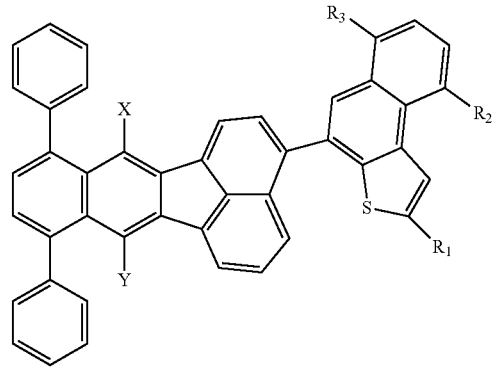

wherein X and Y independently represents an aromatic or a hetero aromatic hydrocarbon having a carbon number of from 5 to 10, the hetero aromatic hydrocarbon is optionally substituted by 1 to 3 methyl groups, and $R_1$ to $R_7$ are independently selected from the group consisting of hydrogen, deuterium, alkyl, alkoxy, amino, silyl, cyano, aryl, and heteoaryl.

2. The compound of claim 1, wherein X and Y are selected from the group consisting of phenyl, 2,4,6-trimethylphenyl, 2-tolyl, 3-tolyl, 4-tolyl, 4-pyridyl, 1-naphthyl, and 2-naphthyl.

3. An organic electroluminescent device that utilizes a compound represented by a formula selected from the group consisting of Formulae (II) to (XIII) according to claim 1.

4. The organic electroluminescent device of claim 3, wherein the compound is adapted to be a material in an electron transport layer or an electron injection layer as a single material or in combination with an n-type dopant material.

5. The organic electroluminescent device of claim 3, wherein the compound is adapted to be a material in one selected from the group consisting of a light emitting layer, a hole block layer and an electron block layer.

6. The organic electroluminescent device of claim 3, wherein the compound is adapted to be a material in a light emitting layer used in combination with a fluorescent or a phosphorescent emitter.

7. The organic electroluminescent device of claim 3, which is one of a fluorescent organic electroluminescent device and a phosphorescent organic electroluminescent device.

\* \* \* \* \*